(12) United States Patent
Nam et al.

(10) Patent No.: US 10,043,580 B2
(45) Date of Patent: *Aug. 7, 2018

(54) THREE-DIMENSIONAL NONVOLATILE MEMORY AND RELATED READ METHOD DESIGNED TO REDUCE READ DISTURBANCE

(71) Applicant: SAMSUNG ELECTRONICS CO., LTD., Suwon-si, Gyeonggi-Do (KR)

(72) Inventors: Sang-Wan Nam, Hwaseong-si (KR); Won-Taeck Jung, Hwaseong-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 15/790,257

(22) Filed: Oct. 23, 2017

(65) Prior Publication Data

US 2018/0047448 A1   Feb. 15, 2018

Related U.S. Application Data

(63) Continuation of application No. 15/203,826, filed on Jul. 7, 2016, now Pat. No. 9,799,400, which is a (Continued)

(30) Foreign Application Priority Data

Feb. 28, 2013 (KR) .......................... 10-2013-0022313

(51) Int. Cl.
  *G11C 16/04*   (2006.01)
  *G11C 16/10*   (2006.01)
  (Continued)

(52) U.S. Cl.
  CPC .......... *G11C 16/0483* (2013.01); *G11C 16/08* (2013.01); *G11C 16/10* (2013.01);
  (Continued)

(58) Field of Classification Search
  CPC ..... G11C 16/0483; G11C 16/08; G11C 16/10; G11C 16/24; G11C 16/26; G11C 16/3427
  (Continued)

(56) References Cited

U.S. PATENT DOCUMENTS 7,433,233 B2  10/2008  Chen et al.
7,495,956 B2   2/2009  Fong et al.
7,719,902 B2   5/2010  Dong et al.
7,760,550 B2   7/2010  Fayrushin et al.
(Continued)

FOREIGN PATENT DOCUMENTS

KR   100842752 B1   7/2008

*Primary Examiner* — Huan Hoang
(74) *Attorney, Agent, or Firm* — Volentine, Whitt & Francos, PLLC

(57) ABSTRACT

A nonvolatile memory device performs a read operation comprising first and second intervals. In the first interval the device applies a turn-on voltage to string selection lines and ground selection lines connected to the string selection transistors and the ground selection transistors, respectively. In the second interval, the device applies a turn-off voltage to unselected string selection lines and unselected ground selection lines while continuing to apply the turn-on voltage to a selected string selection line and a selected ground selection line. In both the first and second intervals, the device applies a first read voltage to a selected wordline connected to memory cells to be read by the read operation and applying a second read voltage to unselected wordlines among connected to memory cells not to be read by the read operation.

18 Claims, 24 Drawing Sheets

Related U.S. Application Data continuation of application No. 14/880,820, filed on Oct. 12, 2015, now Pat. No. 9,418,749, and a continuation of application No. 14/153,164, filed on Jan. 13, 2014, now Pat. No. 9,190,151.

(51) Int. Cl.
  *G11C 16/26* (2006.01)
  *G11C 16/34* (2006.01)
  *G11C 16/08* (2006.01)
  *G11C 16/24* (2006.01)

(52) U.S. Cl.
  CPC ............. *G11C 16/24* (2013.01); *G11C 16/26* (2013.01); *G11C 16/3427* (2013.01)

(58) Field of Classification Search
  USPC ..................................... 365/185.17
  See application file for complete search history.

(56) References Cited

U.S. PATENT DOCUMENTS

| | | |
|---|---|---|
| 7,852,676 B2 | 12/2010 | Maejima |
| 8,107,292 B2 | 1/2012 | Maejima |
| 8,208,306 B2 | 6/2012 | Pyeon et al. |
| 8,456,918 B2 | 6/2013 | Oh et al. |
| 8,582,361 B2 | 11/2013 | Maejima |
| 8,670,285 B2 | 3/2014 | Dong et al. |
| 9,190,151 B2 | 11/2015 | Nam |
| 9,418,749 B2 | 8/2016 | Nam et al. |
| 2011/0019486 A1 | 1/2011 | Jang et al. |
| 2011/0058427 A1 | 3/2011 | Choi et al. |
| 2011/0075484 A1 | 3/2011 | Lee et al. |
| 2011/0116322 A1 | 5/2011 | Seol et al. |
| 2011/0235424 A1 | 9/2011 | Pyeon et al. |
| 2012/0020155 A1 | 1/2012 | Kim |
| 2012/0051136 A1 | 3/2012 | Kang et al. |
| 2012/0201080 A1 | 8/2012 | Kang et al. |
| 2013/0170297 A1 | 7/2013 | Nam et al. |
| 2015/0348636 A1* | 12/2015 | Choe ...................... G11C 16/14 365/185.2 |

* cited by examiner

Fig. 4

| | CS11 (Selected) | CS21 (Unselected) | CS31 (Unselected) | CS41 (Unselected) |
|---|---|---|---|---|
| SSL | VON1 (VREAD) | VON1 (VREAD) | VON2 (VP) | VON2 (VP) |
| Unselected WL | VR1 (VREAD) | | | |
| Selected WL | VR2 (VRD) | | | |
| GSL | VON1 (VREAD) | | VON2 (VP) | |

Fig. 5

| | CS11 (Selected) | CS21 (Unselected) | CS31 (Unselected) | CS41 (Unselected) |
|---|---|---|---|---|
| SSL | VON1 (VREAD) | VOFF (VSS) | VOFF (VSS) | VOFF (VSS) |
| Unselected WL | VR1 (VREAD) | | | |
| Selected WL | VR2 (VRD) | | | |
| GSL | V1 (VREAD) | | | VOFF (VSS) |

Fig. 9

| | CS11 (Selected) | CS21 (Unselected) | CS31 (Unselected) | CS41 (Unselected) |
|---|---|---|---|---|
| SSL | VON1 (VREAD) | VON1 (VREAD) | VON1 (VREAD) | VON1 (VREAD) |
| Unselected WL | | VR1 (VREAD) | | |
| Selected WL | | VR2 (VRD) | | |
| GSL | VON1 (VREAD) | VON1 (VREAD) | VON1 (VREAD) | VON1 (VREAD) |

Fig. 11

| | CS11 (Selected) | CS21 (Unselected) | CS31 (Unselected) | CS41 (Unselected) |
|---|---|---|---|---|
| SSL | VON1 (VREAD) | VON1 (VREAD) | VON2 (VP) | VON2 (VP) |
| Unselected WL | VR1 (VREAD) | | | |
| Selected WL | VON3 (VP2) | | | |
| GSL | VON1 (VREAD) | | VON2 (VP) | |

Fig. 13

| | CS11 (Selected) | CS21 (Unselected) | CS31 (Unselected) | CS41 (Unselected) |
|---|---|---|---|---|
| SSL | VON1 (VREAD) | VON1 (VREAD) | VON1 (VREAD) | VON1 (VREAD) |
| Unselected WL | | VR1 (VREAD) | | |
| Selected WL | | VON1 (VREAD) | | |
| GSL | VON1 (VREAD) | VON1 (VREAD) | VON1 (VREAD) | VON1 (VREAD) |

Fig. 15

| | CS11 (Selected) | CS21 (Unselected) | CS31 (Unselected) | CS41 (Unselected) |
|---|---|---|---|---|
| SSL | VON2 (VP) | VON2 (VP) | VON2 (VP) | VON2 (VP) |
| Unselected WL | VON2 (VP) | | | |
| Selected WL | VR2 (VRD) | | | |
| GSL | VON2 (VP) | VON2 (VP) | VON2 (VP) | VON2 (VP) |

Fig. 17

|  | CS11 (Selected) | CS21 (Unselected) | CS31 (Unselected) | CS41 (Unselected) |
|---|---|---|---|---|
| SSL | VON2 (VP) | VON2 (VP) | VON2 (VP) | VON2 (VP) |
| Unselected WL | VON2 (VP) | VON2 (VP) | VON2 (VP) | VON2 (VP) |
| Selected WL | VON2 (VP) | VON2 (VP) | VON2 (VP) | VON2 (VP) |
| GSL | VON2 (VP) | VON2 (VP) | VON2 (VP) | VON2 (VP) |

THREE-DIMENSIONAL NONVOLATILE MEMORY AND RELATED READ METHOD DESIGNED TO REDUCE READ DISTURBANCE

CROSS-REFERENCE TO RELATED APPLICATIONS

This is a Continuation of U.S. application Ser. No. 15/203,826, filed Jul. 7, 2016, which is a Continuation of U.S. application Ser. No. 14/880,820, filed Oct. 12, 2015, issued a U.S. Pat. No. 9,418,749 on Aug. 16, 2016, which is a Continuation of U.S. application Ser. No. 14/153,164, filed Jan. 13, 2014, issued as U.S. Pat. No. 9,190,151 on Nov. 17, 2015, which claims priority under 35 U.S.C. § 119 to Korean Patent Application No. 10-2013-0022313 filed Feb. 28, 2013, the subject matter of which is hereby incorporated by reference.

BACKGROUND OF THE INVENTION

The inventive concept relates generally to semiconductor memory devices, and more particularly, to nonvolatile memory devices and related methods for performing read operations with reduced read disturbance.

Semiconductor memory devices can be roughly divided into two categories according to whether they retain stored data when disconnected from power. These categories include volatile memory devices, which lose stored data when disconnected from power, and nonvolatile memory devices, which retain stored data when disconnected from power.

Examples of volatile memory devices include static random access memory (SRAM) devices, dynamic random access memory (DRAM) devices, and synchronous DRAM (SDRAM) devices. Examples of nonvolatile memory devices include flash memory devices, read only memory (ROM) devices, programmable ROM (PROM) devices, electrically erasable and programmable ROM (EEPROM) devices, and various forms of resistive memory such as phase-change RAM (PRAM), ferroelectric RAM (FRAM), and resistive RAM (RRAM).

In recent years, researchers have developed three-dimensional (3D) semiconductor memory devices in an effort to increase the integration density of semiconductor memory devices. Structural characteristics of 3D semiconductor memory devices are different from those of two-dimensional (2D) semiconductor memory devices, so they require different driving methods compared to the 2D semiconductor memory devices. For example, due to their different structural characteristics, the 3D semiconductor memory devices may experience different electrical parasitics, which may require driving voltages to be provided with different levels and timing compared to 2D semiconductor memory devices.

SUMMARY OF THE INVENTION

In one embodiment of the inventive concept, a method is provide for performing a read operation in a nonvolatile memory comprising multiple cell strings each comprising multiple memory cells stacked in a direction perpendicular to a substrate, a ground selection transistor disposed between the memory cells and the substrate, and a string selection transistor disposed between the memory cells and a bitline. During a first interval, the method applies a first turn-on voltage to string selection lines connected to string selection transistors of a first group of cell strings among the multiple cell strings, and to a first ground selection line connected in common to ground selection transistors of the first group of cell strings, and applies a second turn-on voltage to string selection lines connected to string selection transistors of a second group of cell strings among the multiple cell strings, and to a second ground selection line connected in common to ground selection transistors of the second group of cell strings. During a second interval following the first interval, the method applies the first turn-on voltage to a string selection line of a selected cell string among the first group of cell strings, and to the first ground selection line, and applies a turn-off voltage to string selection lines of unselected cell strings among the first group of cell strings, to string selection lines of cell strings in the second group of cell strings, and to the second ground selection line. During both the first and second intervals, the method applies a first read voltage to a selected wordline among wordlines connected to memory cells of the first group of cell strings and the second group of cell strings, and applies a second read voltage to unselected wordlines among the wordlines connected to memory cells of the first group of cell strings and the second group of cell strings of the wordlines.

In another embodiment of the inventive concept, a nonvolatile memory comprises a memory cell array comprising multiple cell strings each cell string comprising multiple memory cells stacked in a direction perpendicular to a substrate, a ground selection transistor disposed between the memory cells and the substrate, and a string selection transistor disposed between the memory cells and a bitline, an address decoder connected to multiple memory cells of the cell strings through wordlines, to string selection transistors of the cell strings through string selection lines, and to ground selection transistors of the cell strings through ground selection lines, and a read/write circuit connected to string selection transistors of the cell strings through bitlines. In a read operation, the address decoder applies a turn-on voltage to string selection lines and ground selection lines connected to the string selection transistors and ground selection transistors, respectively, and then applies a turn-off voltage to unselected string selection lines and unselected ground selection lines among the string selection lines and ground selection lines while continuing to apply the turn-on voltage to a selected string selection line and a selected ground selection line among the string selection lines and ground selection lines.

In another embodiment of the inventive concept, a method is provided for performing a read operation in a nonvolatile memory comprising multiple cell strings each comprising multiple memory cells stacked in a direction perpendicular to a substrate, a ground selection transistor disposed between the memory cells and the substrate, and a string selection transistor disposed between the memory cells and a bitline. In a first interval of the read operation, the method applies a turn-on voltage to string selection lines and ground selection lines connected to the string selection transistors and the ground selection transistors, respectively. In a second interval following the first interval, the method applies a turn-off voltage to unselected string selection lines and unselected ground selection lines among the string selection lines and ground selection lines while continuing to apply the turn-on voltage to a selected string selection line and a selected ground selection line among the string selection lines and ground selection lines. In both the first and second intervals, the method applies a first read voltage to a selected wordline connected to memory cells to be read by the read operation and applying a second read voltage to unselected wordlines among connected to memory cells not to be read by the read operation.

These and other embodiments of the inventive concept can potentially reduce read disturbances by turning on various string and ground selection transistors in a predetermined order and with predetermined levels such that boosted charges are discharged through the string and ground selection transistors and a potential distribution in different cell strings becomes substantially uniform.

BRIEF DESCRIPTION OF THE DRAWINGS

The drawings illustrate selected embodiments of the inventive concept. In the drawings, like reference numbers indicate like features.

FIGS. 4 and 5 are diagrams illustrating a first example of voltages that can be used in the method of FIG. 3.

FIG. 9 is a diagram of a second example of voltages that can be used in the method of FIG. 3.

FIG. 11 is a diagram of a third example of voltages that can be used in the method of FIG. 3.

FIG. 13 is a diagram of a fourth example of voltages that can be used in the method of FIG. 3.

FIG. 15 is a diagram of a fifth example of voltages that can be used in the method of FIG. 3.

FIG. 17 is a diagram of a sixth example of voltages that can be used in the method of FIG. 3.

DETAILED DESCRIPTION

Figure 1:
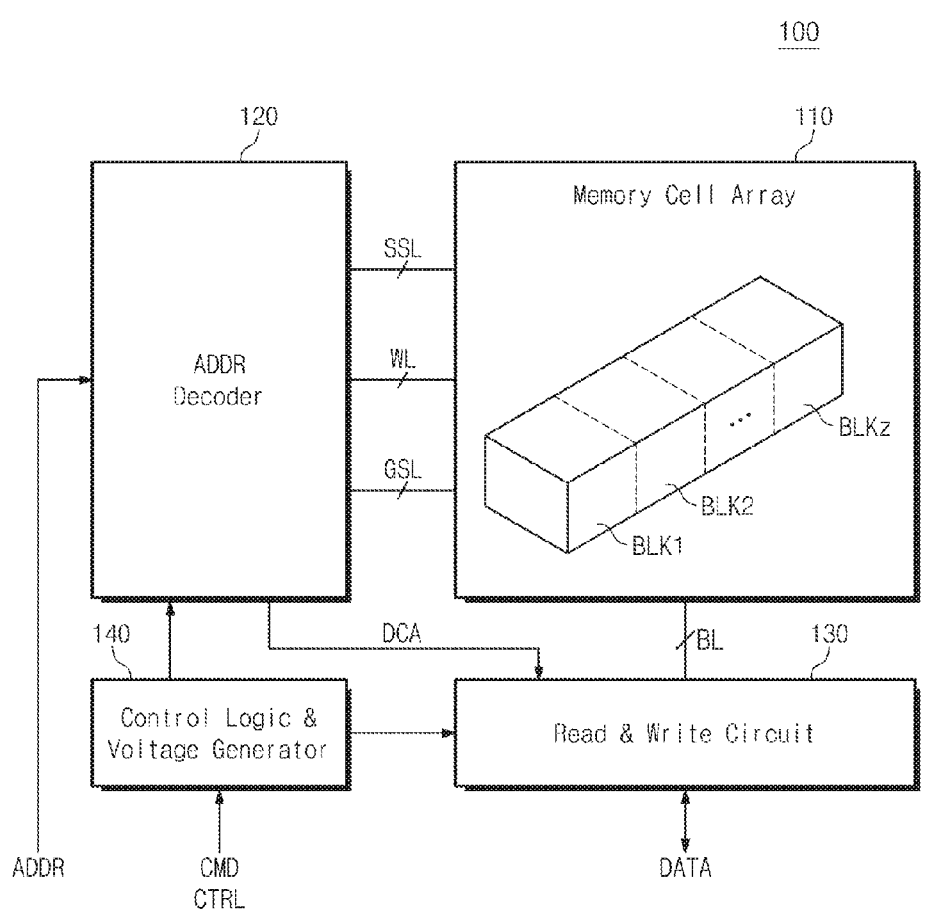
FIG. 1 is a block diagram of a nonvolatile memory device according to an embodiment of the inventive concept.

Embodiments of the inventive concept are described below with reference to the accompanying drawings. These embodiments are presented as teaching examples and should not be construed to limit the scope of the inventive concept.

In the description that follows, the terms "first", "second", "third", etc., may be used to describe various features, but these features should not be limited by these terms. Rather, these terms are used merely to distinguish between different features. Thus, a first feature could be termed a second feature without departing from the teachings of the inventive concept.

Spatially relative terms, such as "beneath", "below", "lower", "under", "above", "upper" and the like, may be used for ease of description to describe one feature's relationship to another feature(s) as illustrated in the figures. The spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the terms "below" and "under" can encompass both an orientation of above and below. The device may be otherwise oriented (rotated 90 degrees or at other orientations) and the spatially relative descriptors used herein interpreted accordingly. In addition, it will also be understood that where a layer is referred to as being "between" two layers, it can be the only layer between the two layers, or one or more intervening layers may also be present.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. Terms such as "comprises" and/or "comprising," where used in this specification, indicate the presence of stated features but do not preclude the presence or addition of one or more other features. As used herein, the term "and/or" includes any and all combinations of one or more of the associated listed items.

Where a feature is referred to as being "on", "connected to", "coupled to", or "adjacent to" another feature, it can be directly on, connected, coupled, or adjacent to the other feature, or intervening features may be present. In contrast, where a feature is referred to as being "directly on," "directly connected to", "directly coupled to", or "immediately adjacent to" another feature, there are no intervening features present.

Unless otherwise defined, all terms (including technical and scientific terms) used herein have the same meaning as commonly understood by one of ordinary skill in the art. Terms such as those defined in commonly used dictionaries should be interpreted as having a meaning that is consistent with their meaning in the context of the relevant art and/or the present specification and will not be interpreted in an idealized or overly formal sense unless expressly so defined herein.

The term "selected memory block" denotes a memory block selected for programming, erasing, or reading, from among multiple memory blocks. The term "selected sub block" denotes a sub block selected for programming, erasing, or reading, from among multiple sub blocks in one memory block.

The term "selected bitline" or "selected bitlines" denotes a bitline or bitlines connected to a cell transistor to be programmed or read, from among multiple bitlines. The term "unselected bitline" or "unselected bitlines" denotes a bitline or bitlines connected to a cell transistor to be program-inhibited or read-inhibited, from among multiple bitlines.

The term "selected string selection line" denotes a string selection line connected to a cell string including a cell transistor to be programmed or read, from among multiple string selection lines. The term "unselected string selection line" or "unselected string selection lines" denotes a remaining string selection line or remaining string selection lines other than the selected string selection line from among multiple string selection lines. The term "selected string selection transistors" denotes string selection transistors connected to a selected string selection line. The term "unselected string selection transistors" denotes string selection transistors connected to an unselected string selection line or unselected string selection lines.

The term "selected ground selection line" denotes a ground selection line connected to a cell string including a cell transistor to be programmed or read, among multiple ground selection lines. The term "unselected ground selection line" denotes a remaining ground selection line or remaining ground selection lines other than the selected ground selection line from among multiple ground selection lines. The term "selected ground selection transistors" denotes ground selection transistors connected to a selected ground selection line. The term "unselected ground selection transistors" denotes ground selection transistors connected to an unselected ground selection line or unselected ground selection lines.

The term "unselected wordline" denotes a wordline, connected to a cell transistor to be programmed or read, from among multiple wordlines. The term "unselected wordline" or "unselected wordlines" denotes a remaining wordlines or remaining wordlines other than a selected wordline from among multiple wordlines.

The term "selected memory cell" or "selected memory cells" denotes memory cells to be programmed or read among multiple memory cells. The term "unselected memory cell" or "unselected memory cells" denotes a remaining memory cell or remaining memory cells other than a selected memory cell or selected memory cells from among multiple memory cells.

Embodiments of the inventive concept will be described with reference to a NAND flash memory. However, the inventive concept is not limited thereto. For example, the inventive concept may also be applied to nonvolatile memory devices such as an EEPROM, a NOR flash memory, PRAM, a Magnetic RAM (MRAM), RRAM, an FRAM, and the like.

FIG. 1 is a block diagram of a nonvolatile memory device 100 according to an embodiment of the inventive concept.

Referring to FIG. 1, nonvolatile memory device 100 comprises a memory cell array 110, an address decoder 120, a read/write circuit 130, and control logic and voltage generator block 140.

Memory cell array 110 is connected to address decoder 120 through wordlines WL, string select lines SSL, and ground selection lines GSL and to read/write circuit 130 through bitlines BL. Memory cell array 110 comprises multiple memory blocks BLK1 to BLKz, each of which multiple memory cells and multiple selection transistors. The memory cells are connected to the wordlines, and the selection transistors are connected to string select lines SSL or ground selection lines GSL. The memory cells of each memory block are stacked in a direction perpendicular to a substrate to form a 3D structure. Each memory cell stores one or more bits.

Address decoder 120 is connected to memory cell array 110 through wordlines WL, string select lines SSL, and ground selection lines GSL. Address decoder 120 operates under control of control logic and voltage generator block 140. Address decoder 120 receives an address ADDR from an external device.

Address decoder 120 is configured to decode a row address of the received address ADDR. Address decoder 120 selects wordlines WL, string select lines SSL, and ground selection lines GSL based on the decoded row address. Address decoder 120 receives various voltages from control logic and voltage generator block 140 and transfers the received voltages to selected and unselected string selection lines SSL, wordlines WL and ground selection lines GSL.

Address decoder 120 is configured to decode a column address of the received address ADDR. Address decoder 120 transfers decoded column address DCA to read/write circuit 130. For example, address decoder 120 may comprise features such as a row decoder, a column address, an address buffer, and so on.

Read/write circuit 130 is connected to memory cell array 110 through bitlines BL, and it exchanges data with the external device. Read/write circuit 130 operates under control of control logic and voltage generator block 140. Read/write circuit 130 receives decoded column address DCA from address decoder 120, and it selects bitlines BL using the decoded column address.

Read/write circuit 130 receives data from the external device, and it writes the received data at memory cell array 110. Read/write circuit 130 reads data from memory cell array 110 and transfers the read data to the external device. Read/write circuit 130 reads data from a first storage region of memory cell array 110 and writes the read data to a second storage region of memory cell array 110. For instance, read/write circuit 130 may perform a copy-back operation.

Read/write circuit 130 typically comprises features such as a page buffer (or, page register), a column selection circuit, a data buffer, and so on. In some embodiments, read/write circuit 130 may also include features such as a sense amplifier, a write driver, a column selection circuit, a data buffer, and so on.

Control logic and voltage generator block 140 is connected to address decoder 120 and read/write circuit 130. Control logic and voltage generator block 140 is configured to control operations of nonvolatile memory device 100. Control logic and voltage generator block 140 is generally configured to generate various voltages used by nonvolatile memory device 100. Control logic and voltage generator block 140 operates in response to a control signal CTRL and a command CMD transferred from the external device.

Figure 2:
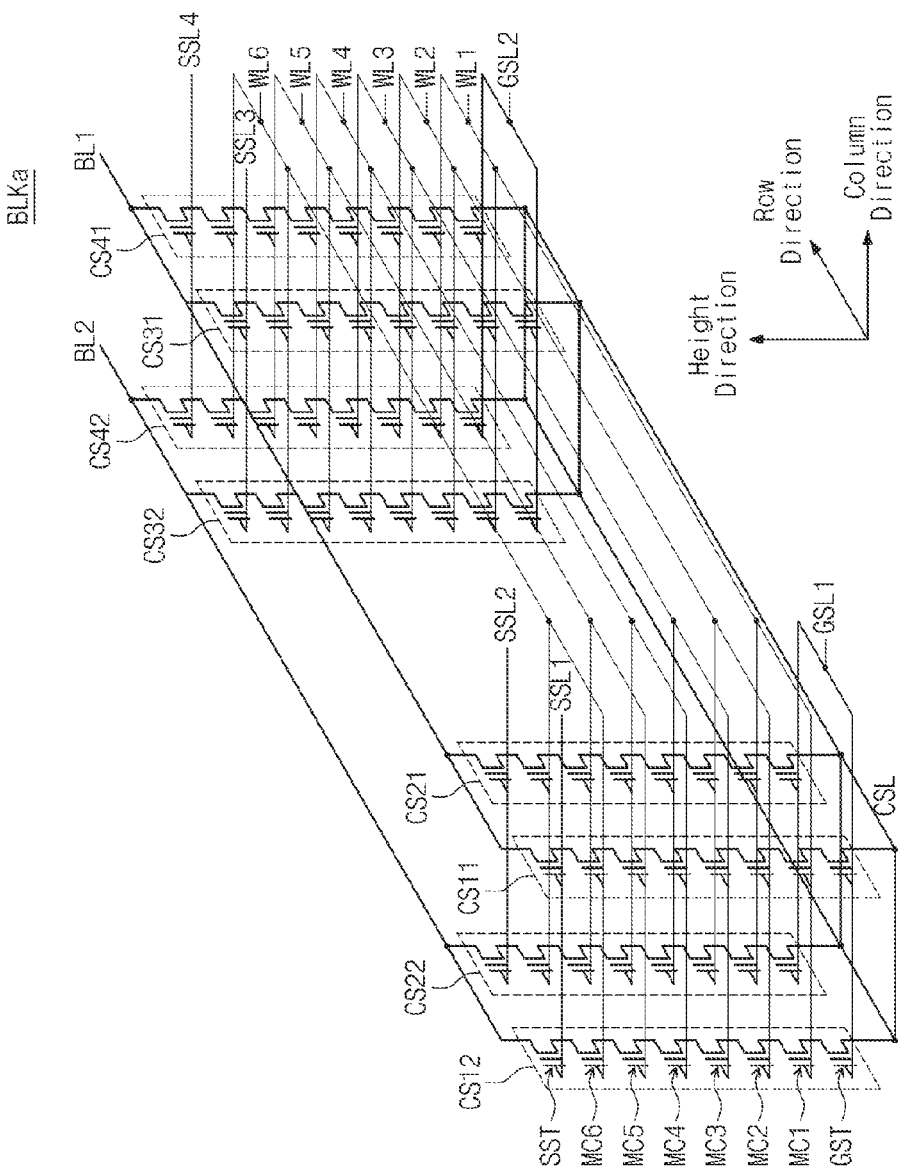
FIG. 2 is a circuit diagram of a memory block according to an embodiment of the inventive concept.

FIG. 2 is a circuit diagram of a memory block BLKa according to an embodiment of the inventive concept. Memory block BLKa is a representative example of one of memory blocks BLK1 to BLKz of memory cell array 110 of FIG. 1.

Referring to FIGS. 1 and 2, memory block BLKa comprises multiple cell strings CS11 to CS41 and CS12 to CS42. Cell strings CS11 to CS41 and CS12 to CS42 are arranged along a row direction and a column direction and form rows and columns.

Each of cell strings CS11 to CS41 and CS12 to CS42 comprises a ground selection transistor GST, memory cells MC1 to MC6, and a string selection transistor SST. In each of cell strings CS11 to CS41 and CS12 to CS42, ground selection transistor GST, memory cells MC1 to MC6, and string selection transistor SST may be stacked in a height direction perpendicular to a substrate.

Rows of cell strings CS11 to CS41 and CS12 to CS42 are connected to different string selection lines SSL1 to SSL4, respectively. For example, string selection transistors SST in cell strings CS11 and CS12 are connected in common to string selection line SSL1, and string selection transistors SST in cell strings CS21 and CS22 are connected in common to string selection line SSL2. String selection transistors SST in cell strings CS31 and CS32 are connected in common to string selection line SSL3, and string selection transistors SST in cell strings CS41 and CS42 are connected in common to string selection line SSL4.

Columns of cell strings CS11 to CS41 and CS12 to CS42 are connected to different bitlines BL1 and BL2, respectively. For example, string selection transistors SST in cell strings CS11 to CS41 are connected in common to bitline BL1, and string selection transistors SST in cell strings CS12 to CS42 are connected in common to bitline BL2.

At least two rows of cell strings are connected in common to a ground selection line, and cell strings CS11 to CS41 and CS12 to CS42 are connected to at least two different ground selection lines GSL1 and GSL2. For example, ground selection transistors GST of cell strings CS11, CS21, CS12, and CS22 are connected in common to ground selection line GSL1, and ground selection transistors GST of cell strings CS31, CS41, CS32, and CS42 are connected in common to ground selection line GSL2.

Memory cells at the same height from a substrate (or, ground selection transistors GST) are connected in common to a wordline, and memory cells at different heights are connected to different wordlines. For example, memory cells MC1 are connected in common to a wordline WL1, and memory cells MC2 are connected in common to a wordline WL2. Memory cells MC3 are connected in common to a wordline WL3, and memory cells MC4 are connected in common to a wordline WL4. Memory cells MC5 are connected in common to a wordline WL5, and memory cells MC6 are connected in common to a wordline WL6. Ground selection transistors GST of cell strings CS11 to CS41 and CS12 to CS42 are connected in common to a common source line CSL.

Memory block BLKa illustrated in FIG. 2 is merely an example, and the inventive concept is not limited to the features of this memory block. For example, the number of rows of cell strings may be increased or decreased. As the number of rows of cell strings is varied, the number of string selection lines connected to rows of cell strings and the number of cell strings connected to a bitline may be also changed. As the number of rows of cell strings is varied, the number of ground selection lines connected to at least two rows of cell strings may be also changed.

The number of columns of cell strings may be increased or decreased. As the number of columns of cell strings is varied, the number of bitlines connected to columns of cell strings and the number of cell strings connected to a string selection line may be also changed.

The height of cell strings may be increased or decreased. For example, the number of stacked memory cells in each cell string may be increased or decreased. In this case, the number of wordlines may be also changed. For example, the number of ground or string selection transistors in each cell string may increase. In this case, the number of ground or string selection lines may be also changed. If the number of ground or string selection transistors increases, ground or string selection transistors may be stacked substantially the same as such a manner that the memory cells are stacked.

In some embodiments, a read operation and a write operation may be performed by a unit of a row of cell strings. Cell strings CS11 to CS41 and CS12 to CS42 may be selected by a two-row unit by ground selection lines GSL1 and GSL2 and by a row unit by string selection lines SSL1 to SSL4.

In a selected row of cell strings, the read operation and the write operation may be performed by a page unit. A page may be a row of memory cells connected to a wordline. In a selected row of cell strings, memory cells may be selected by a page unit by wordlines WL1 to WL6.

Figure 3:
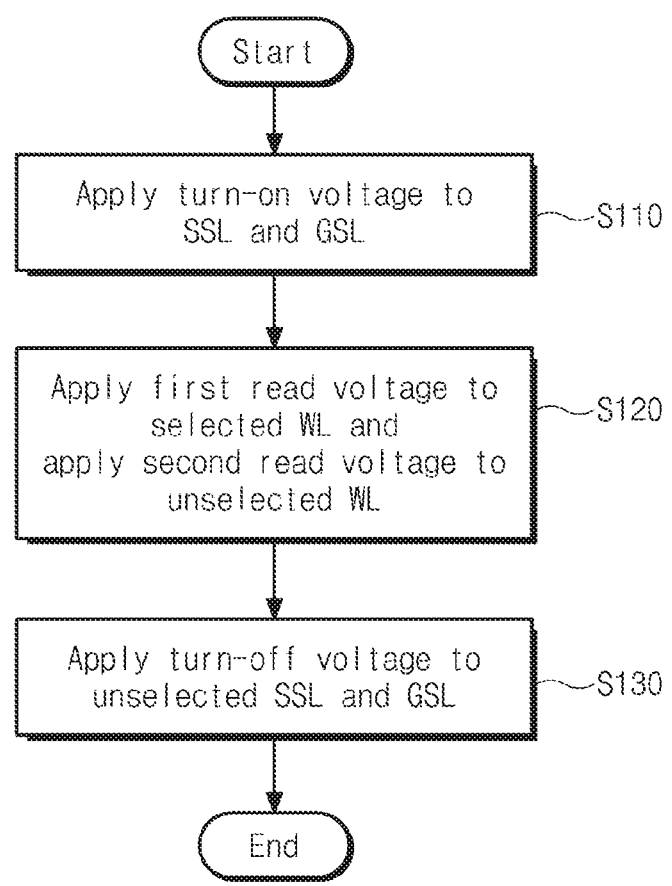
FIG. 3 is a flowchart illustrating a method of performing a read operation in a nonvolatile memory according to an embodiment of the inventive concept.

FIG. 3 is a flowchart illustrating a read method of a nonvolatile memory 100 according to an embodiment of the inventive concept.

Referring to FIGS. 2 and 3, in operation S110, a turn-on voltage is applied to string selection lines SSL1 and SSL4 and ground selection lines GSL1 and GSL2. In operation S120, a first read voltage is applied to a selected wordline, and a second read voltage is applied to unselected wordlines. The first read voltage and the second read voltage may be simultaneously applied. In operation S130, a turn-off voltage is applied to unselected string selection lines and unselected ground selection lines.

Various examples of the timing and voltage levels to be used in connection with operations S110 through S130 will be presented with reference to FIG. 4 through 18 below.

FIGS. 4 and 5 are diagrams illustrating a first example of voltages that can be used in the method of FIG. 3. The voltages illustrated in FIG. 4 are applied to cell strings CS11 to CS41 in a first interval of a read operation, and the voltages illustrated in FIG. 5 are applied to cell strings CS11 to CS41 in a second interval of the read operation following the first interval.

In FIGS. 4 and 5, as well as similar diagrams such as those in FIGS. 9, 11, 13, 15, and 17, specific cell strings are labeled along an upper x-axis, and various signal lines are labeled along a left y-axis. The signal lines corresponding to those cell strings are written in a generic form, i.e., SSL rather than SSL1, SSL2, etc.; GSL rather than GSL1, GSL2, etc.; and so on. Their specific form can be inferred from FIG. 2 in combination with the relevant cell string labels. For instance, cell string CS11 corresponds to string selection line SSL1 and ground selection line GSL1, cell string CS41 corresponds to string selection line SSL4 and ground selection line GSL2, and so on.

Shading is used in FIG. 5 to indicate voltages that change between the first and second intervals of FIGS. 4 and 5. Although FIGS. 4 and 5 illustrate voltages applied to a first row of cell strings CS11 to CS41, the same voltages is applied to a second row of cell strings CS12 to CS42.

Referring to FIG. 4, cell string CS11 is selected, and cell strings CS21 to CS41 are unselected. A turn-on voltage is applied to string selection lines SSL1 to SSL4 and ground selection lines GSL1 and GSL2. The turn-on voltage is a voltage for turning on string and ground selection transistors SST and GST.

In further detail, a first turn-on voltage VON1 is applied to a selected ground selection line GSL1 connected to the selected cell string CS11, and a second turn-on voltage is applied to an unselected ground selection line GSL2.

First turn-on voltage VON1 is applied to a selected string selection line SSL1 connected to the selected cell string CS11. First turn-on voltage VON1 is applied to an unselected string selection line SSL2 corresponding to the selected ground selection line GSL1. In other words, first turn-on voltage VON1 is applied to both a string selection line of a selected cell string, as well as a string selection line of an unselected cell string that shares a ground selection line with the selected cell string. Second turn-on voltage VON2 is applied to unselected string selection lines SSL3 and SSL4 corresponding to the unselected ground selection line GSL2.

In the illustrated examples, first turn-on voltage VON1 is a read voltage VREAD, which is a high voltage. Read voltage VREAD has a level sufficient to turn on memory cell transistors, string selection transistors, or ground selection transistors, regardless of whether those transistors are in a programmed state. Second turn-on voltage VON2 is a positive voltage VP lower than read voltage VREAD.

A first read voltage VR1 is applied to unselected wordlines. First read voltage VR1 is also read voltage VREAD. A second read voltage VR1 is applied to a selected wordline. Second read voltage VR1 is a selection read voltage VRD for determining program states of memory cells MC1 to MC6. Selection read voltage VRD may have one of various voltage levels used to determine threshold voltage distributions according to program states of memory cells MC1 to MC6.

Referring to FIG. 5, a turn-off voltage VOFF is applied to unselected string selection lines SSL2 to SSL4 and the unselected ground selection line GSL2. The turn-off voltage VOFF is a voltage with a level sufficient to turn off the string and ground selection transistors SST and GST. For example, the turn-off voltage VOFF may be a ground voltage VSS.

Figure 6:
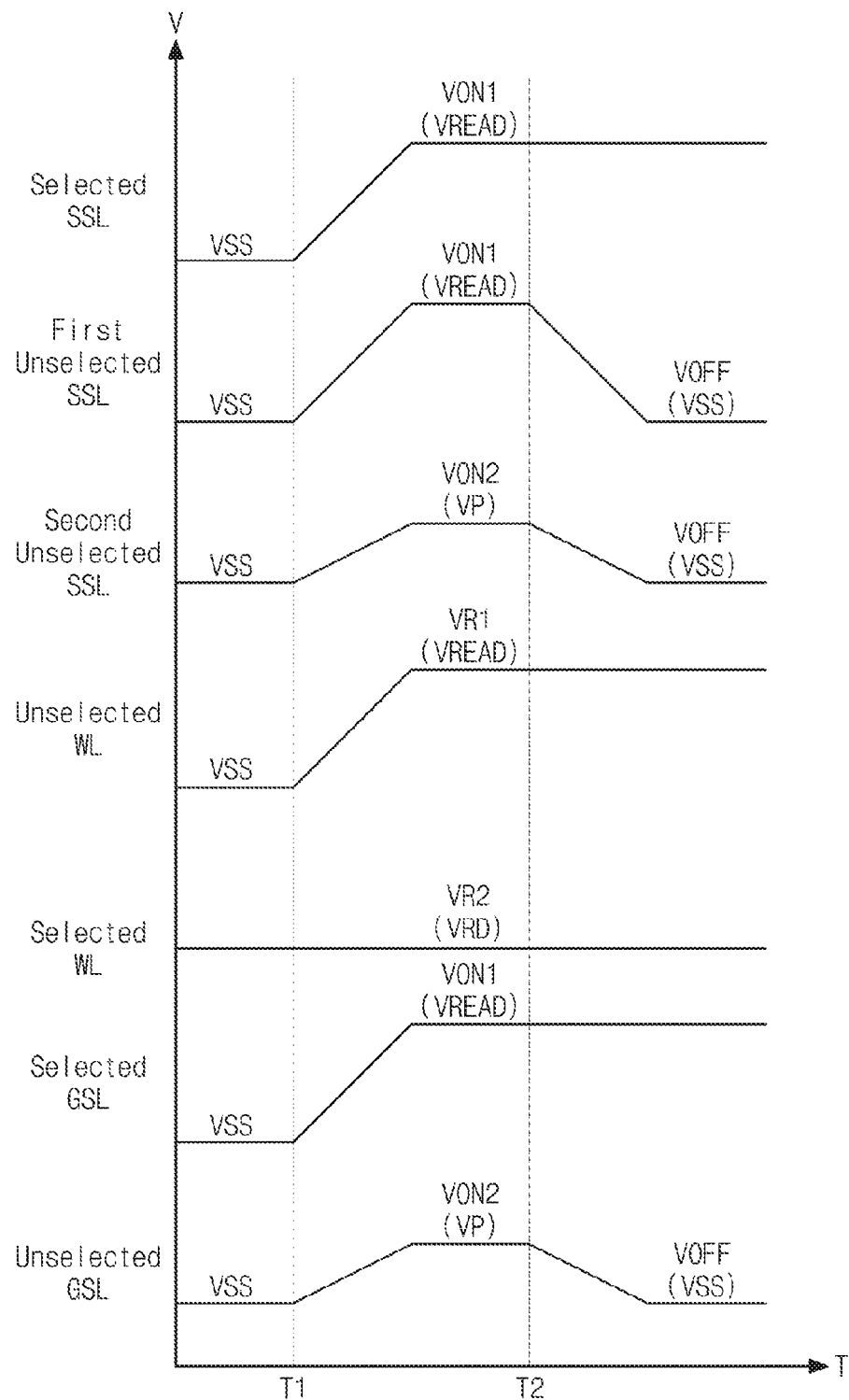
FIG. 6 is a timing diagram of an example read operation using the voltages illustrated in FIGS. 4 and 5.

FIG. 6 is a timing diagram of an example read operation using the voltages illustrated in FIGS. 4 and 5. In FIG. 6, the first interval of FIG. 4 is between a time T1 and a time T2, and the second interval of FIG. 5 is after time T2.

Referring to FIG. 6, at time T1, first turn-on voltage VON1 is applied to selected string selection line SSL1. First turn-on voltage VON1 is also applied to a first unselected string selection line. The first unselected string selection line may be an unselected string selection line SSL2 corresponding to a selected ground selection line GSL1. Second turn-on voltage VON2 is applied to second unselected string selection lines. The second unselected string selection lines may be unselected string selection lines SSL3 and SSL4 corresponding to unselected ground selection line GSL2.

First read voltage VR1 is applied to an unselected wordline, and second read voltage VR2 is applied to a selected wordline. For example, second read voltage VR2 may be ground voltage VSS. First turn-on voltage VON1 is applied to the selected ground selection line GSL1, and second turn-on voltage VON2 is applied to the unselected ground selection line GSL2.

At time T2, turn-off voltage VOFF is applied to the first unselected string selection line SSL2 and second unselected string selection lines SSL3 and SSL4. The turn-off voltage VOFF is applied to the unselected ground selection line GSL2. Voltages of the selected string selection line SSL1, the selected ground selection line GSL1, the selected wordline and the unselected wordlines may be maintained between the first and second intervals.

Figure 7:
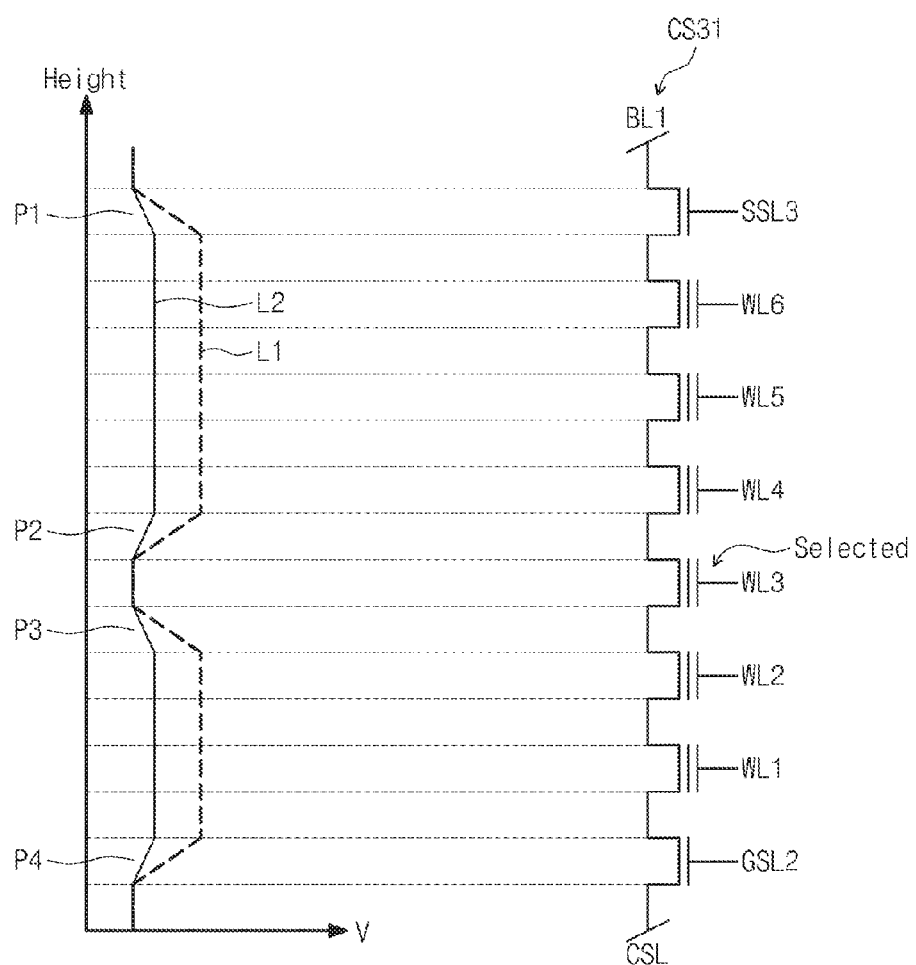
FIG. 7 is a diagram of a channel voltage of a cell string CS31 when a read operation is performed using the voltages illustrated in FIGS. 4 to 6.

FIG. 7 is a diagram of a channel voltage of a cell string CS31 when voltages are applied according to FIGS. 4 to 6.

Referring to FIG. 7, a cell string CS31 connected to an unselected ground selection line GSL2 and an unselected string selection line SSL3 and a channels voltage of cell string CS31 are illustrated. A horizontal axis indicates a channel voltage, and a vertical axis indicates a height. A first line L1 shown in dotted line represents a channel voltage in a device using a conventional read method, and a second line L2 shown in solid line represents a channel voltage in a device using the voltages of FIGS. 4 to 6.

In the conventional read method, a turn-on voltage is not applied to an unselected ground selection line GSL2 and second unselected string selection lines SSL3 and SSL4 in a first interval. Thus, a string selection transistor SST and a ground selection transistor GST in cell string CS31 maintain a turn-off state. A string channel of cell string CS31 may be floated.

A first read voltage VR1 is applied to unselected wordlines WL1, WL2, and WL4 to WL6. At this time, coupling is generated between the unselected wordlines WL1, WL2, and WL4 to WL6 and memory cells MC1 to MC6. Voltages of channels of memory cells MC1, MC2, and MC4 to MC6 may be boosted by the coupling as illustrated by the first line L1.

At a point P1, a potential difference is generated between a bitline BL1 and a channel of memory cell MC6. At a point P2, a potential difference is generated between channels of memory cells MC4 and MC3. At a point P3, a potential difference is generated between channels of memory cells MC3 and MC2. At a point P4, a potential difference is generated between a channel of memory cell MC6 and a common source line CSL.

The potential difference may cause generation of hot electrons at points P1 to P4. The hot electrons may be accumulated at memory cells MC1 to MC6, string selection transistor SST or ground selection transistor GST. The accumulated hot electrons may cause variations in threshold voltages of memory cells MC1 to MC6, a threshold voltage of string selection transistor SST or a threshold voltage of ground selection transistor GST. That is, potential differences at points P1 to P4 may cause read disturbances.

According to an embodiment of the inventive concept, second turn-on voltage VON2 is applied to the second unselected string selection lines SSL3 and SSL4 and the unselected ground selection line GSL2 at the same time when first read voltage VR1 is applied to the unselected wordlines WL1, WL2, and WL4 to WL6. If second turn-on voltage VON2 is applied, string selection transistor SST and ground selection transistor GST may be turned on.

A channel voltage corresponding to memory cells MC4 to MC6 is discharged to bitline BL1 through string selection transistor SST. A channel voltage corresponding to memory cells MC1 and MC2 is discharged to common source line CSL through ground selection transistor GST. Thus, channel voltages of memory cells MC1, MC2, and MC4 to MC6 connected to the unselected wordlines WL1, WL2, and WL4 to WL6 may be lowered, so that read disturbance is prevented or reduced.

Also, voltages applied to the second unselected string selection lines SSL3 and SSL4 and the unselected ground selection line GSL2 may be equal to second turn-on voltage VON2. A channel voltage corresponding to memory cells MC1 and MC2 and a channel voltage corresponding to memory cells MC4 to MC6 may be leveled. If channel voltages at both sides of a memory cell MC3 connected to a selected wordline WL3 are leveled, the probability that hot electrons are generated at memory cell MC3 may be reduced. Thus, read disturbance may be prevented or reduced.

Figure 8:
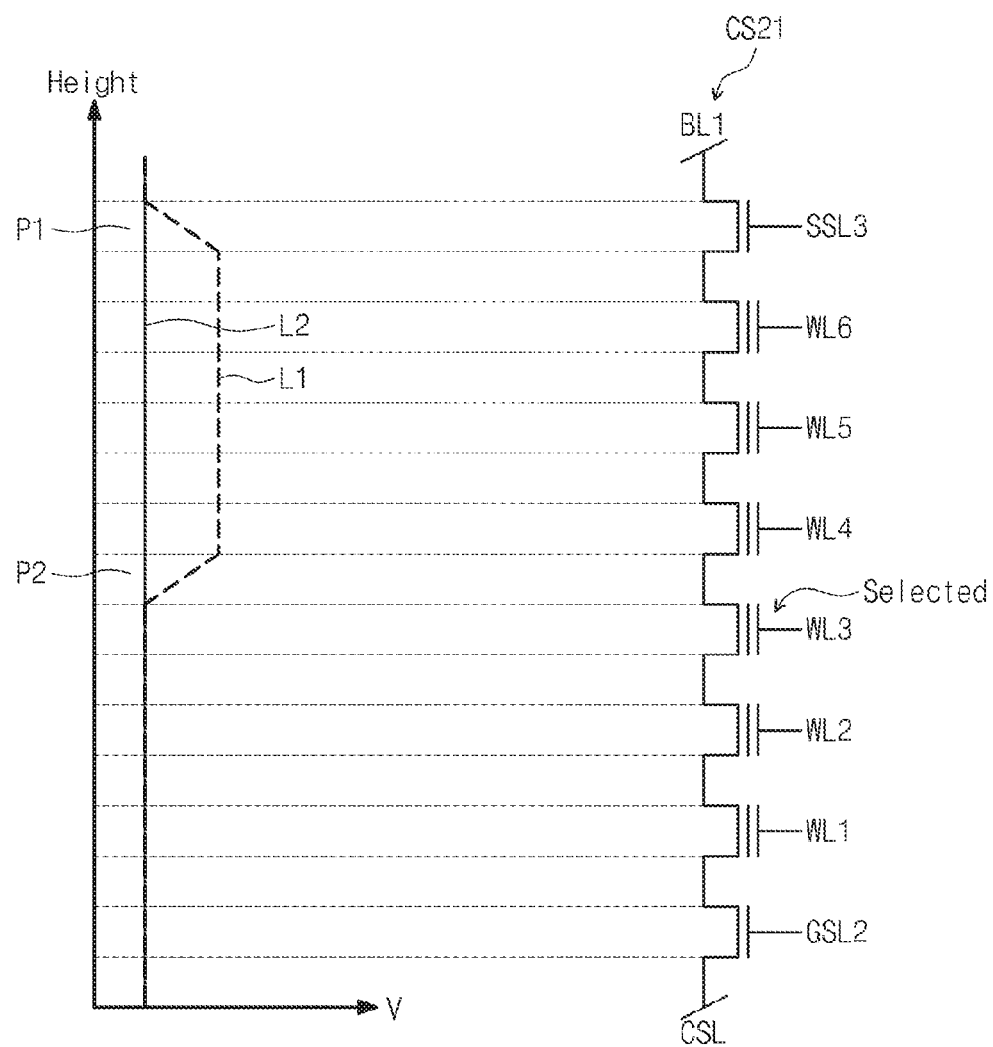
FIG. 8 is a diagram of a channel voltage of a cell string CS21 when a read operation is performed using the voltages illustrated in FIGS. 4 to 6.

FIG. 8 is a diagram of a channel voltage of a cell string CS21 when voltages are applied according to FIGS. 4 to 6.

In FIG. 8, a cell string CS21 connected to a selected ground selection line GSL1 and an unselected string selection line SSL2 and a channels voltage of cell string CS31 are illustrated. In FIG. 8, a horizontal axis indicates a channel voltage, and a vertical axis indicates a height. In FIG. 7, a first line L1 shown in dotted line shows a channel voltage of a conventional read method, and a second line L2 shown in solid line shows a channel voltage produced by the voltages of FIGS. 4 to 6.

In the conventional read method, a turn-on voltage is not applied to the selected ground selection line GSL1, and is not be applied to the unselected string selection line SSL2. Thus, a string selection transistor SST in cell string CS21 maintains a turn-off state, and a ground selection transistor GST in cell string CS21 is turned on.

As a first read voltage VR1 is applied to unselected wordlines WL1 and WL2, channels of memory cells MC1 and MC2 are connected to a common source line CSL through a ground selection transistor GST. Because a second read voltage VR2 is applied to a selected wordline WL3, channels of memory cells MC4 to MC6 may be floated. Channel voltages of memory cells MC4 to MC6 may be boosted by first read voltage VR1 applied to wordlines WL4 to WL6.

Thus, as shown in first line L1, channel voltages of memory cells MC1 to MC2 may be discharged to a common source line CSL to maintain a low voltage. Channel voltages of memory cells MC4 to MC6 may be boosted.

At point P1, a potential difference is generated between a bitline BL1 and a channel of memory cell MC6. At point P2, a potential difference is generated between channels of memory cells MC4 and MC3.

The potential differences existing at points P1 and P2 may cause generation of hot electrons. The hot electrons may be accumulated at memory cells MC1 to MC6, string selection transistor SST or ground selection transistor GST. The accumulated hot electrons may cause a variation in threshold voltages of memory cells MC1 to MC6, a threshold voltage of string selection transistor SST or a threshold voltage of ground selection transistor GST. That is, potential differences generated at points P1 and P2 causes read disturbances.

According to an embodiment of the inventive concept, first turn-on voltage VON1 is applied to the unselected string selection line SSL1 at the same time when first read voltage VR1 is applied to the unselected wordlines WL1, WL2, and WL4 to WL6 and first turn-on voltage VON1 is applied to the unselected string selection line SSL1. If first turn-on voltage VON1 is applied, string selection transistor SST and ground selection transistor GST may be turned on.

A channel voltage corresponding to memory cells MC4 to MC6 is discharged to bitline BL1 through string selection transistor SST. Thus, channel voltages of memory cells MC4 to MC6 connected to the unselected wordlines WL4 to WL6 may be lowered, so that read disturbance is prevented or reduced.

Also, voltages applied to the unselected string selection line SSL1 and the selected ground selection line GSL1 may be equal to first turn-on voltage VON1. Thus, a channel voltage corresponding to memory cells MC1 and MC2 and a channel voltage corresponding to memory cells MC4 to MC6 may be leveled. If channel voltages at both sides of a memory cell MC3 connected to a selected wordline WL3 are leveled, the probability that hot electrons are generated at memory cell MC3 may be reduced. Thus, read disturbance may be prevented or reduced.

FIG. 9 is a diagram of a second example of voltages that can be used in the method of FIG. 3. Compared to FIG. 4, first turn-on voltage VON1 is applied to string selection lines SSL1 to SSL4 and ground selection lines GSL1 and GSL2. Afterwards, as illustrated in FIG. 5, a turn-off voltage VOFF is applied to unselected string selection lines SSL2 to SSL4 and an unselected ground selection line GSL2.

Figure 10:
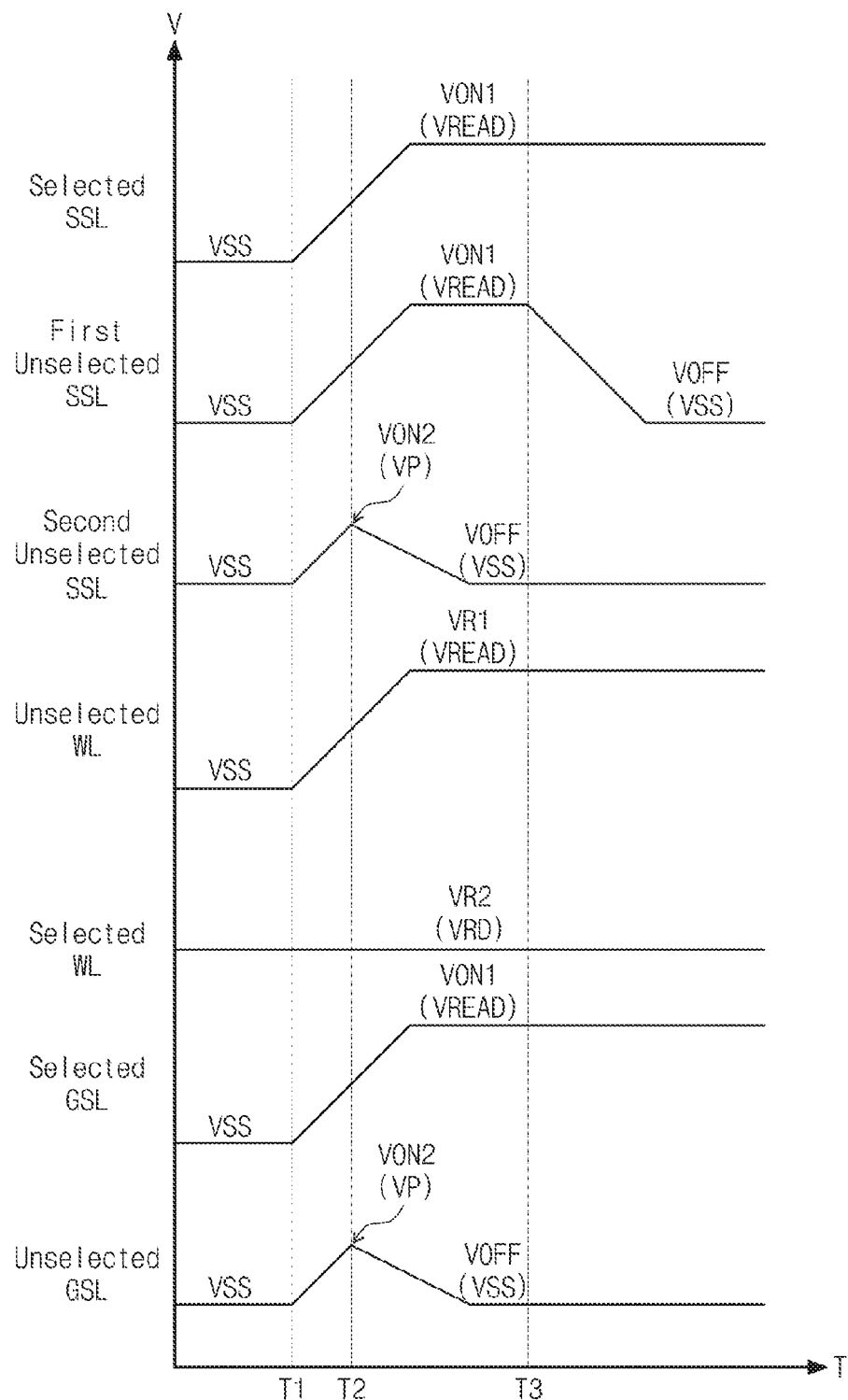
FIG. 10 is a timing diagram of an example read operation using the voltages illustrated in FIGS. 5 and 9.

FIG. 10 is a timing diagram of an example read operation using the voltages illustrated in FIGS. 5 and 9.

Referring to FIGS. 1 to 3, 5, 9 and 10, at time T1, first turn-on voltage VON1 is applied to a selected string selection line SSL1. First turn-on voltage VON1 is applied to a first unselected string selection line. First turn-on voltage VON1 is applied to second unselected string selection lines.

A first read voltage VR1 is applied to an unselected wordline, and a second read voltage VR2 is applied to a selected wordline. First turn-on voltage VON1 is applied to a selected ground selection line GSL1. Second turn-on voltage VON2 is applied to an unselected ground selection line GSL2.

At time T2, an additional operation is performed before voltages of the unselected ground selection line GSL2 and the second unselected string selection lines SSL3 and SSL4 reach a target level of first turn-on voltage VON1. At time T2, turn-off voltage VOFF is applied to the unselected ground selection line GSL2 and the second unselected string selection lines SSL3 and SSL4.

At time T3, an additional operation is performed before a voltage of the first unselected string selection line SSL2 reaches a target level of first turn-on voltage VON1. At time T3, turn-off voltage VOFF is applied to the first unselected string selection line SSL2.

That is, the same voltage is applied to string selection lines SSL1 to SSL4 and ground selection lines GSL1 and GSL2, and the turn-off voltage is applied before voltages of the unselected ground selection line GSL2 and the second unselected string selection lines SSL3 and SSL4 reach a target level. Thus, the same operation as that described with reference to FIGS. 4 to 6 may be performed.

FIG. 11 is a diagram of a third example of voltages that can be used in the method of FIG. 3. Compared to FIG. 4, a third turn-on voltage VON3 is applied to a selected wordline. The third turn-on voltage VON3 may be a positive voltage VP. The third turn-on voltage VON3 can be set to be lower than a read voltage VREAD. Afterwards, as illustrated in FIG. 5, turn-off voltage VOFF is applied to the selected wordline.

Figure 12:
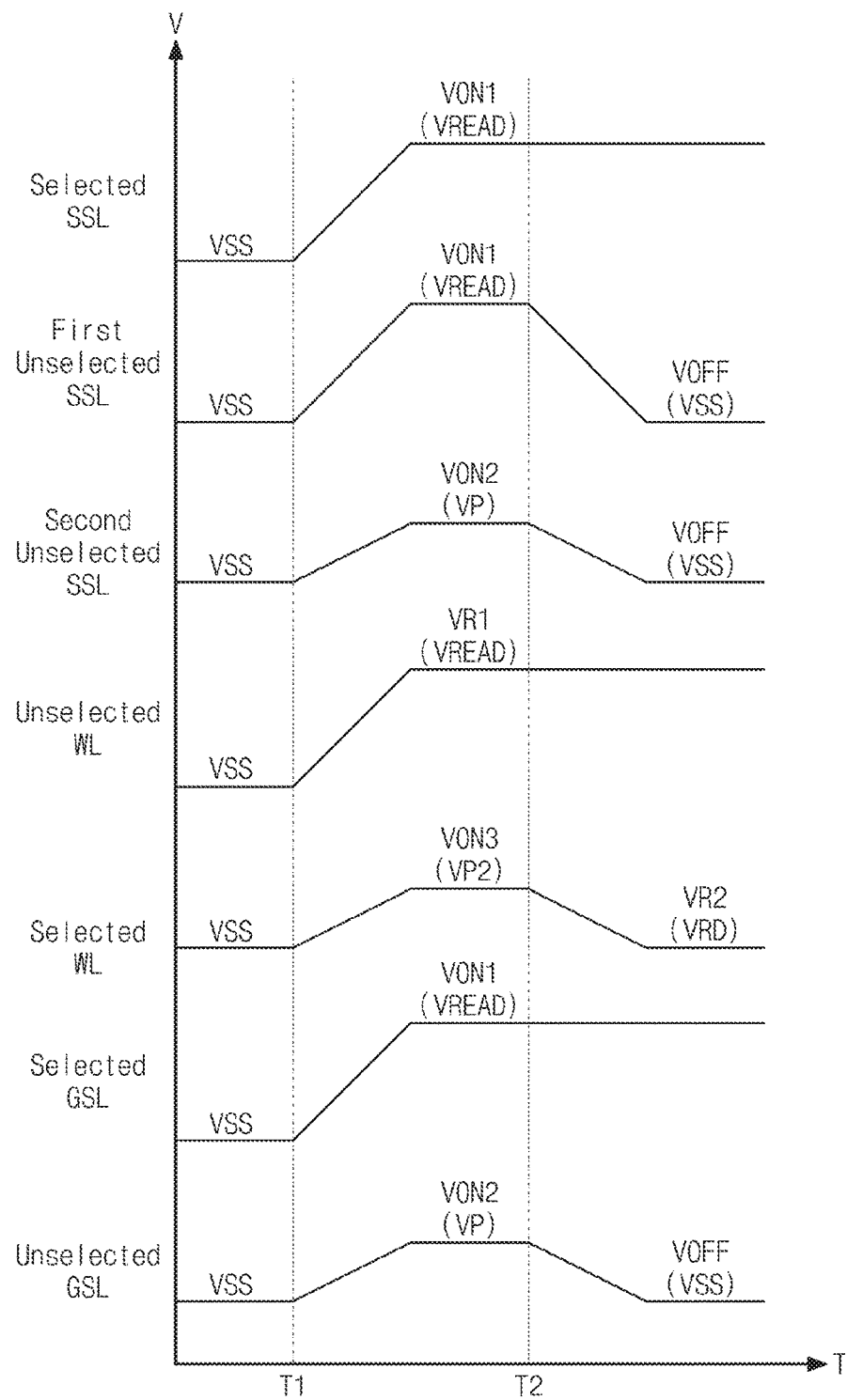
FIG. 12 is a timing diagram of an example read operation using the voltages illustrated in FIGS. 5 and 11.

FIG. 12 is a timing diagram of an example read operation using the voltages illustrated in FIGS. 5 and 11.

Referring to FIGS. 1 to 3, 5, 11 and 12, at time T1, first turn-on voltage VON1 is applied to a selected string selection line SSL1. First turn-on voltage VON1 is applied to a first unselected string selection line. First turn-on voltage VON1 is applied to a second unselected string selection lines.

A first read voltage VR1 is applied to an unselected wordline, and a third read voltage VR3 is applied to a selected wordline. First turn-on voltage VON1 is applied to a selected ground selection line GSL1. First turn-on voltage VON1 is applied to an unselected ground selection line GSL2.

At time T2, turn-off voltage VOFF is applied to a first unselected string selection line SSL2 and to second unselected string selection lines SSL3 and SSL4. The turn-off voltage VOFF is applied to an unselected ground selection line GSL2. A second read voltage VR2 is applied to a selected wordline.

In embodiments described with reference to FIGS. 5, 11 and 12, after the third turn-on voltage VON3 is applied to a selected wordline, second read voltage VR2 is applied. When the third turn-on voltage is applied, memory cells connected to the selected wordline may be turned on.

As described with reference to FIGS. 7 and 8, when second read voltage VR2 is applied to a selected wordline, memory cells connected to the selected wordline may be turned off. At this time, a string channel may be divided into two portions on the basis of the selected wordline.

According to an embodiment of the inventive concept, the third turn-on voltage VON3 is applied to a selected wordline, and then second read voltage VR2 is applied thereto. Thus, channel voltages of memory cells may be leveled before a string channel is divided into two portions by second read voltage VR2. Because channel voltages of memory cells in each cell string are leveled on the basis of a selected memory cell, the probability that hot electrons are generated at the selected memory cell may be suppressed. That is, read disturbance may be further prevented or reduced.

FIG. 13 is a diagram of a fourth example of voltages that can be used in the method of FIG. 3. Compared to FIG. 9, first turn-on voltage VON1 is applied to a selected wordline. The first turn-on voltage may be a read voltage VREAD. Afterwards, as illustrated in FIG. 5, a turn-off voltage is applied to the selected wordline.

Figure 14:
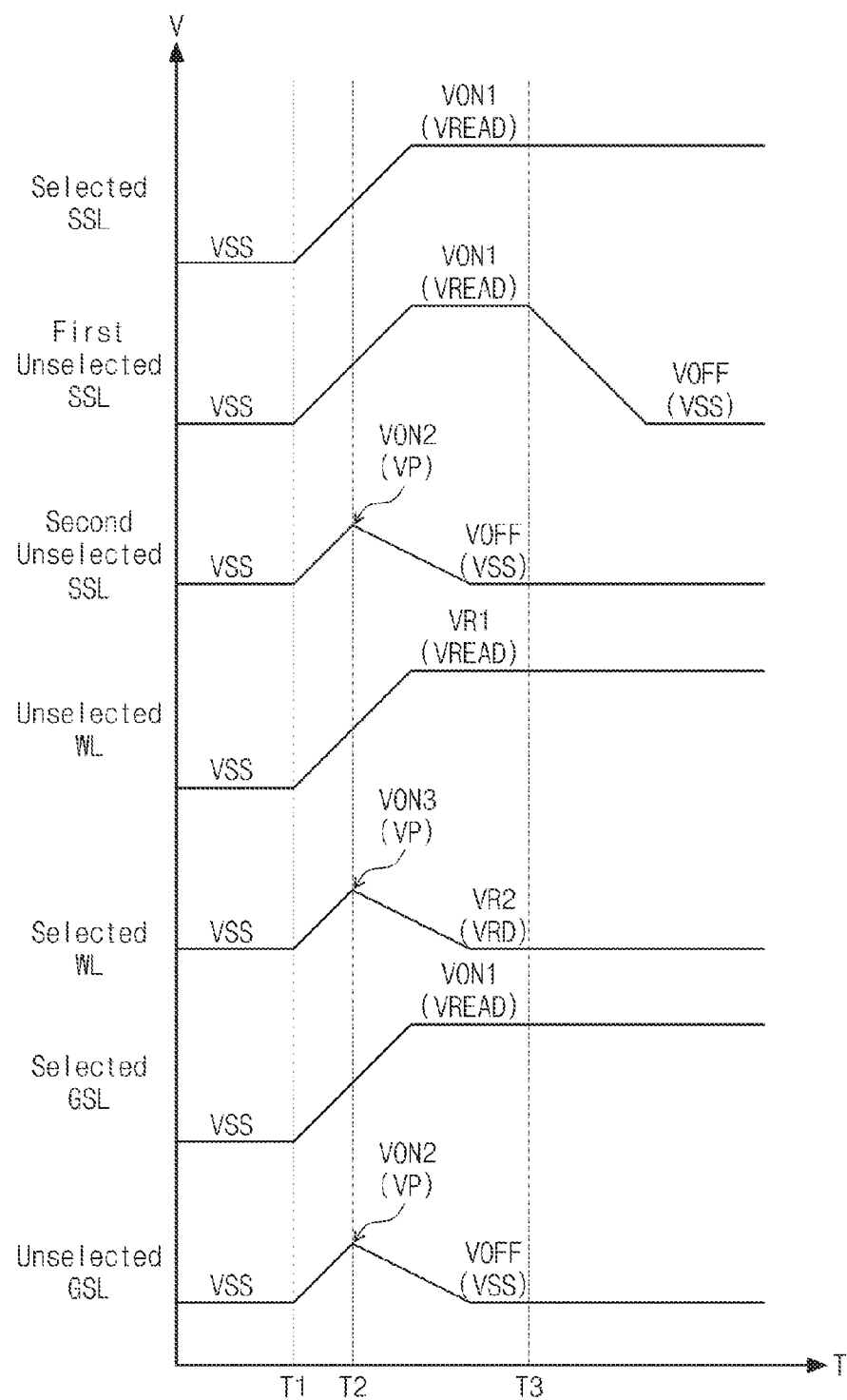
FIG. 14 is a timing diagram of an example read operation using the voltages illustrated in FIGS. 5 and 13.

FIG. 14 is a timing diagram of an example read operation using the voltages illustrated in FIGS. 5 and 13.

Referring to FIGS. 1 to 3, 5, 13 and 14, at time T1, first turn-on voltage VON1 is applied to a selected string selection line SSL1. First turn-on voltage VON1 is applied to a first unselected string selection line. First turn-on voltage VON1 is applied second unselected string selection lines.

A first read voltage VR1 is applied to an unselected wordline, and first turn-on voltage VON1 is applied to a selected wordline. First turn-on voltage VON1 is applied to a selected ground selection line GSL1. First turn-on voltage VON1 is applied to an unselected ground selection line GSL2.

At time T2, an additional operation may be performed before voltages of the unselected ground selection line GSL2 and second unselected string selection lines SSL3 and SSL4 reach a target level of first turn-on voltage VON1. At time T2, turn-off voltage VOFF is applied to the unselected ground selection line GSL2 and the second unselected string selection lines SSL3 and SSL4. A second read voltage VR2 is applied to the selected wordline.

At time T3, an additional operation may be performed before a voltage of the first unselected string selection line SSL2 reaches a target level of first turn-on voltage VON1. At time T3, turn-off voltage VOFF is applied to the first unselected string selection line SSL2.

FIG. 15 is a diagram of a fifth example of voltages that can be used in the method of FIG. 3. Compared to FIG. 4, second turn-on voltage VON2 is applied to all string selection lines SSL, unselected wordlines and all ground selection lines GSL. Afterwards, as illustrated in FIG. 5, first turn-on voltage VON1 is applied to a selected string selection line, a first read voltage VR1 is applied to the unselected wordlines, and turn-off voltage VOFF is applied to an unselected ground selection line GSL.

Figure 16:
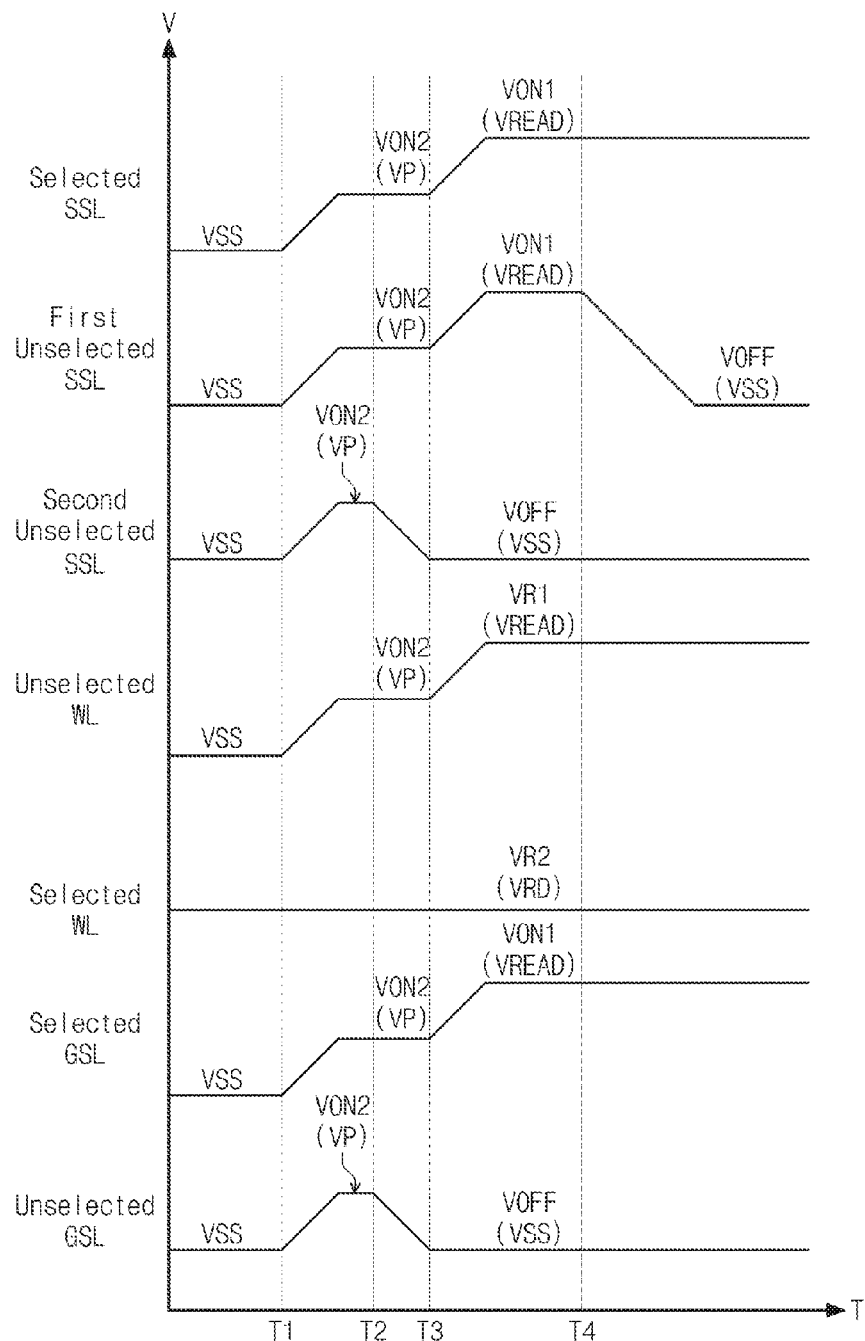
FIG. 16 is a timing diagram of an example read operation using the voltages illustrated in FIGS. 5 and 15.

FIG. 16 is a timing diagram of an example read operation using the voltages illustrated in FIGS. 5 and 15.

Referring to FIGS. 1 to 3, 5, 15 and 16, at time T1, second turn-on voltage VON2 is applied to a selected string selection line SSL1, a first unselected string selection line SSL2, a second unselected string selection line SSL3 or SSL4, unselected wordlines, a selected ground selection line GSL1, and an unselected ground selection line GSL2.

After voltages of the second unselected string selection line SSL3 or SSL4 and the unselected ground selection line GSL2 reach second turn-on voltage VON2, at time T2, turn-off voltage VOFF is applied to the second unselected string selection line SSL3 or SSL4 and the unselected ground selection line GSL2.

After the turn-off voltage VOFF is applied to the second unselected string selection line SSL3 or SSL4 and the unselected ground selection line GSL2, at time T3, first turn-on voltage VON1 is applied to the selected string selection line SSL1 and the first unselected string selection line SSL2. A first read voltage VR1 is applied to the unselected wordlines, and a second read voltage VR2 is applied to the selected wordline. First turn-on voltage VON1 is applied to the selected ground selection line GSL1, and the turn-off voltage VOFF is applied to the unselected ground selection line GSL2.

At time T4, an additional operation is performed after a voltage of the first unselected string selection line SSL2 reaches a target level of first turn-on voltage VON1. At time T4, the turn-off voltage VOFF is applied to the first unselected string selection line SSL2.

FIG. 17 is a diagram of a sixth example of voltages that can be used in the method of FIG. 3. Compared to FIG. 15, second turn-on voltage VON2 is applied to a selected wordline. Afterwards, as illustrated in FIG. 5, first turn-on voltage VON1 is applied to a selected string selection line, a first read voltage VR1 is applied to unselected wordlines, and a turn-off voltage is applied to an unselected ground selection line.

Figure 18:
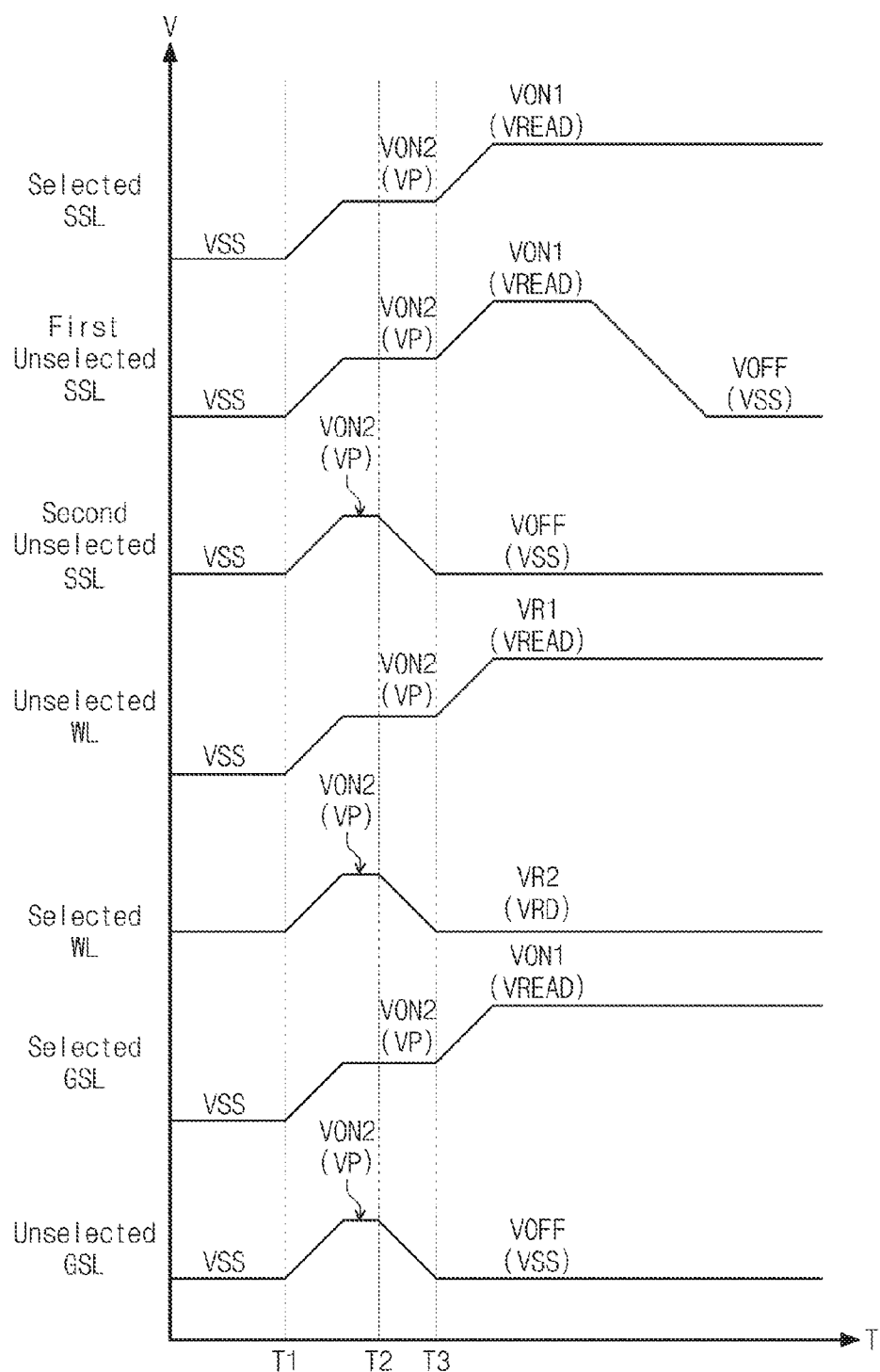
FIG. 18 is a timing diagram of an example read operation using the voltages illustrated in FIGS. 5 and 17.

FIG. 18 is a timing diagram of an example read operation using the voltages illustrated in FIGS. 5 and 17.

Referring to FIGS. 1 to 3, 5, 17 and 18, at time T1, second turn-on voltage VON2 is applied to a selected string selection line SSL1, a first unselected string selection line SSL2, a second unselected string selection line SSL3 or SSL4, a selected wordline, unselected wordlines, a selected ground selection line GSL1, and an unselected ground selection line GSL2.

After voltages of the second unselected string selection line SSL3 or SSL4, the selected wordline and the unselected ground selection line GSL2 reach second turn-on voltage VON2, at time T2, turn-off voltage VOFF is applied to the second unselected string selection line SSL3 or SSL4, the selected wordline and the unselected ground selection line GSL2.

After voltages of the second unselected string selection line SSL3 or SSL4 and the unselected ground selection line GSL2 reach turn-off voltage VOFF, at time T3, first turn-on voltage VON1 is applied to the selected string selection line SSL1 and the first unselected string selection line SSL2. A first read voltage VR1 is applied to the unselected wordlines and a second read voltage VR2 is applied to the selected wordline. First turn-on voltage VON1 is applied to the selected ground selection line GSL1, and the turn-off voltage VOFF is applied to the unselected ground selection line GSL2.

At time T4, an additional operation is performed after a voltage of the first unselected string selection line SSL2 reaches a target level of first turn-on voltage VON1. At time T4, the turn-off voltage VOFF is applied to the first unselected string selection line SSL2.

In example embodiments, voltage applying methods described with reference to FIGS. 6, 10, 12, 14, and 16 may be a preset operation executed at a read operation. The preset operation may be a preparation operation for performing a read operation on cell strings CS11 to CS41 and CS12 to CS42. After the preset operation is performed, a pre-charge voltage is applied to bitlines BL1 and BL2 and a read operation may be performed.

In the preset operation, voltages for turning on and off string or ground selection transistors may be pre-pulses. The pre-pulses are applied to prevent phenomenon causing an abnormal operation such as read disturbance.

Pre-pulses according to embodiments of the inventive concept may be variously mixed. For example, as described with reference to FIGS. 6, 12, 16, and 18, a part of pre-pulses may be set to be lower than voltages used at a read operation. As described with reference to FIGS. 10 and 14, a part of pre-pulses may be set to have shorter duration as compared to voltages used at a read operation. Various combinations of the lower level and the shorter duration may be made.

Figure 19:
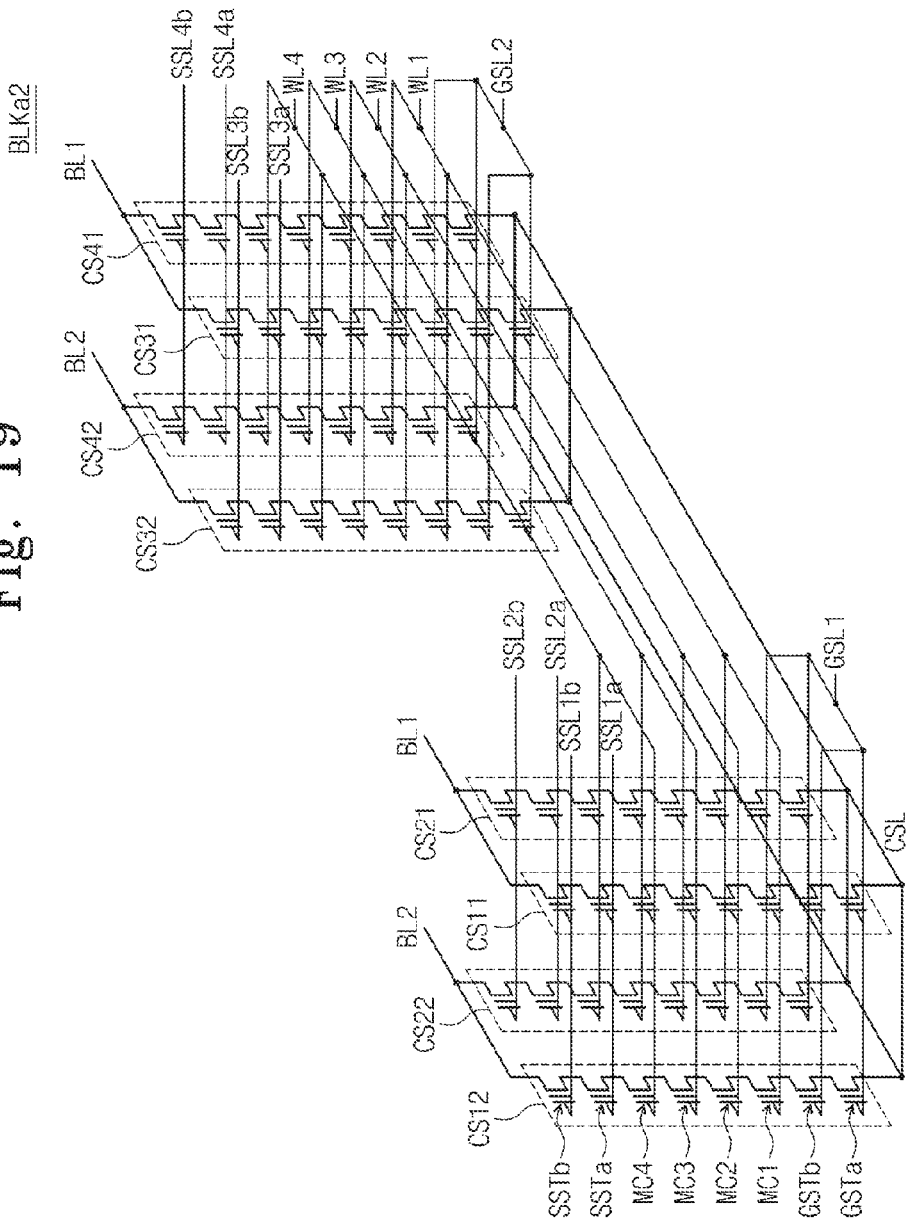
FIG. 19 is a circuit diagram of a memory block according to an embodiment of the inventive concept.

FIG. 19 is a circuit diagram of a memory block BLKb according to an embodiment of the inventive concept. Compared to a memory block BLKa of FIG. 2, a cell string comprises two string selection transistors SSTa and SSTb. In each cell string, string selection transistors SSTa and SSTb may be stacked in a direction perpendicular to a substrate.

In a first row of cell strings CS11 and CS12, string selection transistors SSTa are connected in common to a string selection line SSL1a, and string selection transistors SSTb are connected in common to a string selection line SSL1b. In a second row of cell strings CS21 and CS22, string selection transistors SSTa are connected in common to a string selection line SSL2a, and string selection transistors SSTb are connected in common to a string selection line SSL2b. In a third row of cell strings CS31 and CS32, string selection transistors SSTa are connected in common to a string selection line SSL3a, and string selection transistors SSTb are connected in common to a string selection line SSL3b. In a fourth row of cell strings CS41 and CS42, string selection transistors SSTa are connected in common to a string selection line SSL4a, and string selection transistors SSTb are connected in common to a string selection line SSL4b.

A cell string comprises two ground selection transistors GSTa and GSTb. In each cell string, ground selection transistors GSTa and GSTb may be stacked in a direction perpendicular to the substrate. In first and second rows of cell strings CS11, CS12, CS21, and CS22, ground selection transistors GSTa and GSTb are connected in common to a ground selection line GSL1. In third and fourth rows of cell strings CS31, CS32, CS41, and CS42, ground selection transistors GSTa and GSTb are connected in common to a ground selection line GSL2.

In some embodiments, in each cell string, connection between string selection transistors SSTa and SSTb and string selection lines and connection between ground selection transistors GSTa and GSTb and ground selection lines may be variously changed or modified. For example, like connection between ground selection transistors GSTa and GSTb and ground selection lines GSL1 and GSL2, string selection transistors SSTa and SSTb in a cell string may be connected in common. Alternatively, for example, like connection between string selection transistors SSTa and SSTb and string selection lines SSL1 to SSL4, string selection transistors SSTa and SSTb in a cell string may be connected in common to a string selection line.

Figure 20:
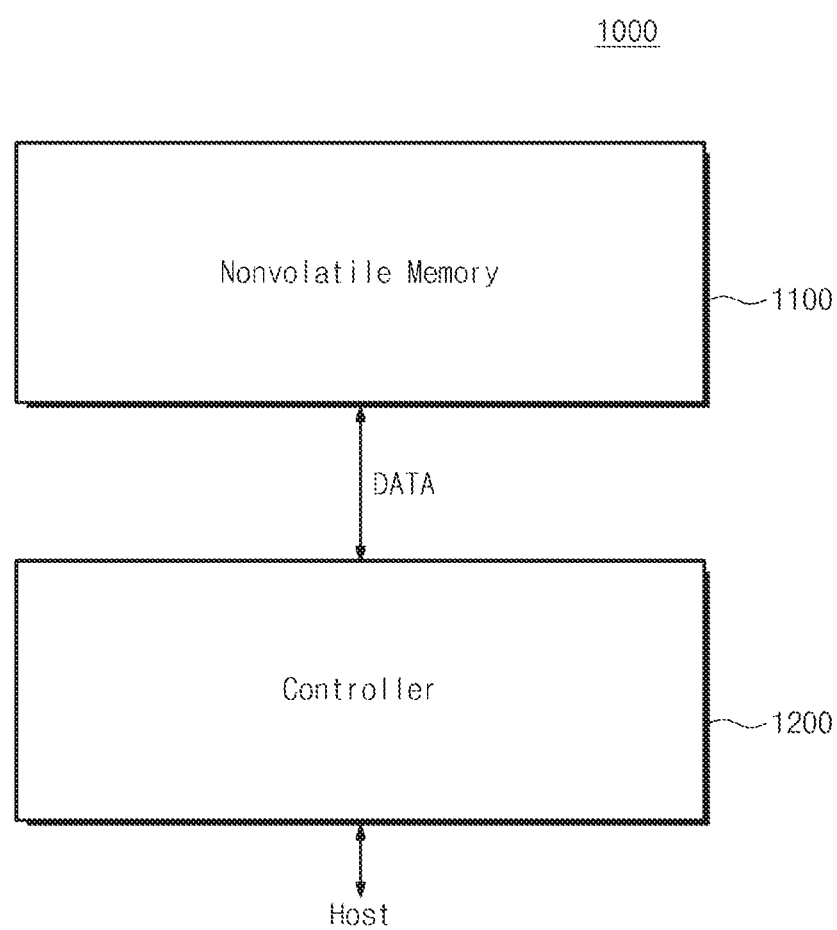
FIG. 20 is a block diagram of a memory system according to an embodiment of inventive concepts.

FIG. 20 is a block diagram of a memory system 1000 according to an embodiment of inventive concepts.

Referring to FIG. 20, memory system 1000 comprises a nonvolatile memory device 1100 and a controller 1200. Nonvolatile memory 1100 may be a nonvolatile memory 100 described with reference to FIGS. 1 to 19. Nonvolatile memory 1100 performs a preset operation for applying pre-pulses as described with reference to FIGS. 1 to 19. Nonvolatile memory 1100 may comprise at least one of nonvolatile memories such as an EEPROM, a flash memory, a PRAM, an RRAM, an FRAM, and so on.

Controller 1200 is connected to nonvolatile memory 1100 and is configured to access nonvolatile memory device 1100. For example, controller 1200 may be adapted to control overall operations of nonvolatile memory 1100 comprising a read operation, a write operation, an erase operation, a background operation, and so on. Controller 1200 provides an interface between nonvolatile memory 1100 and a host. Controller 1200 may be configured to drive firmware for controlling nonvolatile memory 1100.

In some embodiments, controller 1200 may comprise features such as a RAM, a processing unit, a host interface, a memory interface, and an error correction unit. Controller 1200 may communicate with an external device (e.g., a host) according to a particular communication protocol. For example, controller 1200 may communicate with the external device through at least one of various interface protocols such as a universal serial bus (USB) protocol, a multimedia card (MMC) protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, an integrated drive electronics (IDE) protocol, a Firewire protocol, and so on.

Controller 1200 and nonvolatile memory device 1100 may be integrated into a single semiconductor device. For example, controller 1200 and nonvolatile memory device 1100 may be integrated into a single semiconductor device to form a memory card such as a PC card (PCMCIA, personal computer memory card international association), a compact flash card (CF), a smart media card (SM, SMC), a memory stick, a multimedia card (MMC, RS-MMC, MMC-micro), an SD card (SD, miniSD, microSD, SDHC), a universal flash storage (UFS), and so on.

Controller 1200 and nonvolatile memory device 1100 may be integrated into a single semiconductor device to form an SSD. The SSD may comprise a storage unit configured to store data in a semiconductor memory. In the event that memory system 1000 is used as the SSD, the operating speed of the host connected to memory system 1000 may be improved.

As another example, memory system 1000 may be provided as one of various features of an electronic device such as a computer, a ultra-mobile personal computer (UMPC), a workstation, a net-book, a personal digital assistance (PDA), a portable computer (PC), a web tablet, a wireless phone, a mobile phone, a smart phone, a smart television, a 3D television, an e-book, a portable multimedia player (PMP), a portable game console, a navigation device, a black box, a digital camera, a digital multimedia broadcasting (DMB) player, a digital audio recorder, a digital audio player, a digital picture recorder, a digital picture player, a digital video recorder, a digital video player, a device for transmitting and receiving information in a wireless environment, one of various electronic devices constituting a home network, one of various electronic devices constituting a computer network, one of various electronic devices constituting a telematics network, a radio frequency identification (RFID) device, and one of various features constituting a computing system.

Nonvolatile memory device 1100 or memory system 1000 may be packaged in various kinds of packages. For instance, nonvolatile memory device 1100 or memory system 1000 may be implemented with packages such as Package on Package (PoP), Ball Grid Arrays (BGA), Chip Scale Packages (CSP), Plastic Leaded Chip Carrier (PLCC), Plastic Dual In-line Package (PDIP), Die in Waffle Pack, Die in Wafer Form, Chip On Board (COB), Ceramic Dual In-line Package (CERDIP), Plastic Metric Quad Flat Pack (MQFP), Thin Quad Flat Pack (TQFP), Small Outline Integrated Circuit (SOIC), Shrink Small Outline Package (SSOP), Thin Small Outline Package (TSOP), System In Package (SIP), Multi Chip Package (MCP), Wafer-level Fabricated Package (WFP), and Wafer-level Processed Stack Package (WSP).

Figure 21:
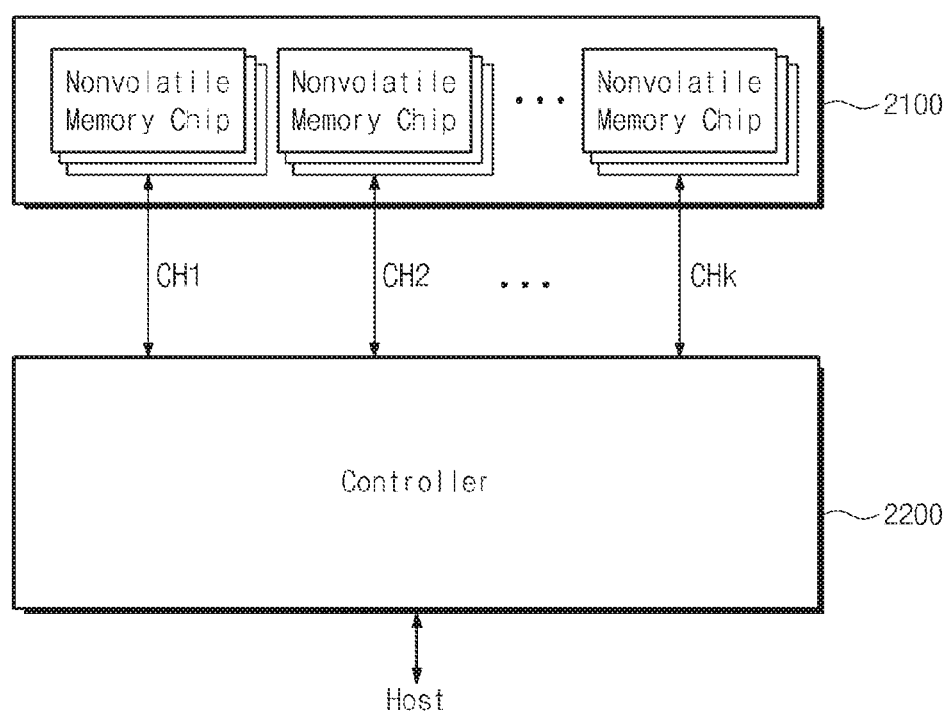
FIG. 21 is a block diagram of a memory system according to an embodiment of the inventive concept.

FIG. 21 is a block diagram of a memory system 2000 according to an embodiment of the inventive concept.

Referring to FIG. 21, memory system 2000 comprises a nonvolatile memory 2100 and a controller 2200. Nonvolatile memory 2100 comprises multiple nonvolatile memory chips, which form multiple groups. Nonvolatile memory chips in each group may be configured to communicate with controller 2200 via one common channel. In certain embodiments, the nonvolatile memory chips communicate with controller 2200 via multiple channels CH1 to CHk.

In some embodiments, each of the nonvolatile memory chips comprises a nonvolatile memory 100 described with reference to FIGS. 1 to 19. Each of the nonvolatile memory chips performs a preset operation for applying pre-pulses as described with reference to FIGS. 1 to 19. In the example of FIG. 21, one channel is connected to multiple nonvolatile memory chips. However, memory system 2000 can be modified such that one channel is connected to one nonvolatile memory chip.

Figure 22:
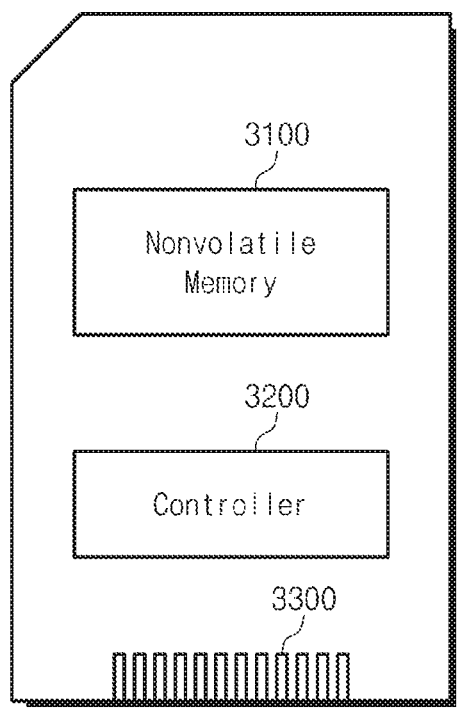
FIG. 22 is a diagram of a memory card according to an embodiment of the inventive concept.

FIG. 22 is a diagram of a memory card 3000 according to an embodiment of the inventive concept.

Referring to FIG. 22, memory card 3000 comprises a nonvolatile memory 3100, a controller 3200, and a connector 3300. Nonvolatile memory 3100 may be a nonvolatile memory 100 described with reference to FIGS. 1 to 19. Nonvolatile memory 3100 may perform a preset operation for applying pre-pulses as described with reference to FIGS. 1 to 19. Connector 3300 may electrically connect memory card 3000 with a host.

Memory card 3000 may be formed of memory cards such as a PC (PCMCIA) card, a CF card, an SM (or, SMC) card, a memory stick, a multimedia card (MMC, RS-MMC, MMCmicro), a security card (SD, miniSD, microSD, SDHC), a universal flash storage (UFS) device, and the like.

Figure 23:
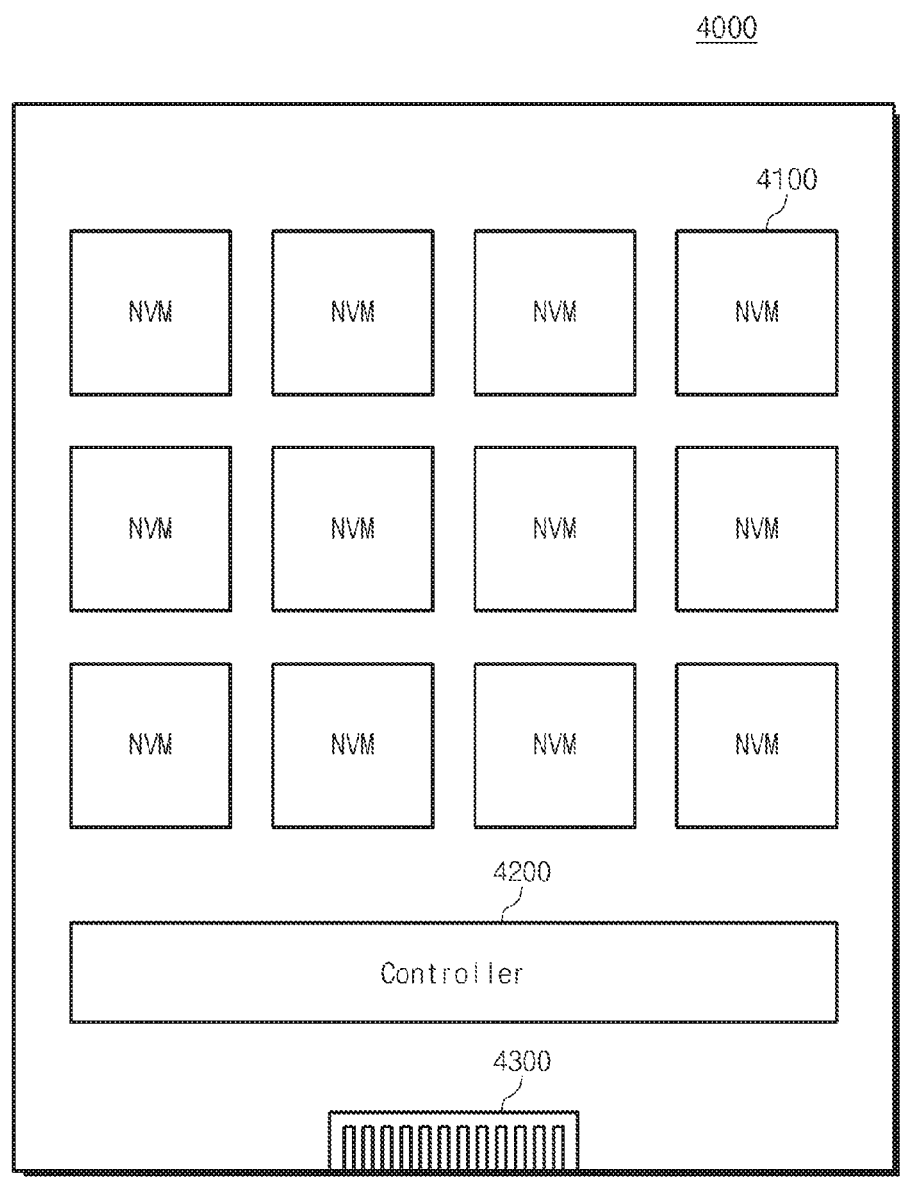
FIG. 23 is a diagram of a solid state drive (SSD) according to an embodiment of the inventive concept.

FIG. 23 is a diagram of an SSD 4000 according to an embodiment of the inventive concept.

Referring to FIG. 23, SSD 4000 comprises multiple nonvolatile memories 4100, a controller 4200, and a connector 4300. Nonvolatile memory 4100 may be a nonvolatile memory 100 described with reference to FIGS. 1 to 19. Nonvolatile memory 4100 may perform a preset operation for applying pre-pulses as described with reference to FIGS. 1 to 19. Connector 4300 may connect solid state driver 4000 with a host electrically.

Figure 24:
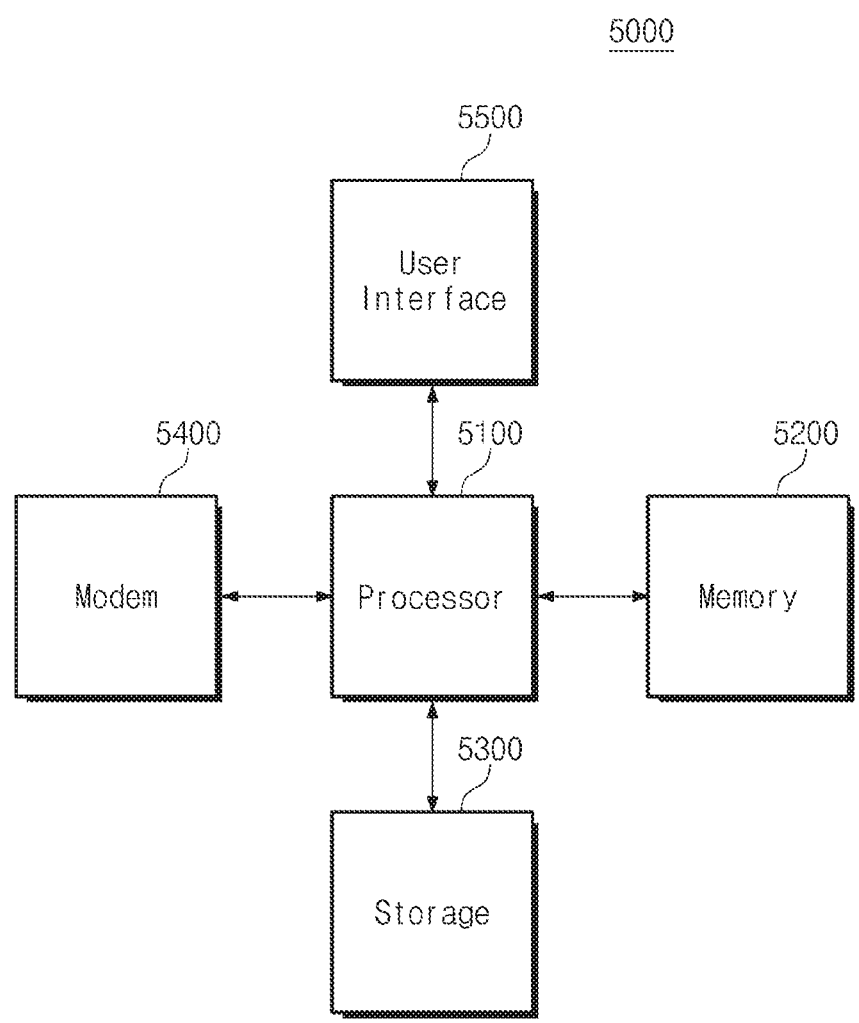
FIG. 24 is a block diagram of a computing device according to an embodiment of the inventive concept.

FIG. 24 is a block diagram of a computing device 5000 according to an embodiment of the inventive concept.

Referring to FIG. 24, computing device 5000 comprises a processor 5100, a memory 5200, storage 5300, a modem 5400, and a user interface 5500.

Processor 5100 controls operations of computing device 5000, and it also performs logical operations. Processor 5100 may be formed of a system-on-chip (SoC). Processor 5100 may be a general purpose processor or an application processor.

Memory 5200 communicates with processor 5100. Memory 5200 may be a working memory (or, a main memory) of processor 5100 or computing device 5000. Memory 5200 may comprise a volatile memory such as a static RAM, a dynamic RAM, a synchronous DRAM, or the like or a nonvolatile memory such as a flash memory, a PRAM, an MRAM, an RRAM, an FRAM, or the like.

Storage 5300 may be used as a working memory or a long term storage memory of computing system 5000. Storage 300 may comprise a hard disk drive or a nonvolatile memory such as a flash memory, MRAM, RRAM, an FRAM, PRAM, or the like.

Storage 5300 may be a nonvolatile memory 100 described with reference to FIGS. 1 to 19. Storage 5300 may perform a preset operation for applying pre-pulses as described with reference to FIGS. 1 to 19.

In various alternative embodiments, memory 5200 and storage 5300 may be formed of a nonvolatile memory of a same type. In this case, memory 5200 and storage 5300 may be integrated into a semiconductor integrated circuit.

Modem 5400 communicates with an external device under control of processor 5100. For example, modem 5400 may communicate with the external device in a wire or wireless manner. Modem 5400 typically communicates based on at least one of wireless communications manners such as Long Term Evolution (LTE), WiMax, Global System for Mobile communication (GSM), Code Division Multiple Access (CDMA), Bluetooth, Near Field Communication (NFC), WiFi, Radio Frequency Identification (RFID), and so on or wire communications manners such as Universal Serial Bus (USB), Serial AT Attachment (SATA), Small Computer Small Interface (SCSI), Firewire, Peripheral Component Interconnection (PCI), and so on.

User interface 5500 may communicate with a user under control of processor 5100. For example, user interface 5500 may comprise user input interfaces such as a keyboard, a keypad, a button, a touch panel, a touch screen, a touch pad, a touch ball, a camera, a microphone, a gyroscope sensor, a vibration sensor, and so on. User interface 5500 may further comprise user output interfaces such as an LCD, an OLED (Organic Light Emitting Diode) display device, an AMOLED (Active Matrix OLED) display device, an LED, a speaker, a motor, and so on.

The foregoing is illustrative of embodiments and is not to be construed as limiting thereof. Although a few embodiments have been described, those skilled in the art will readily appreciate that many modifications are possible in the embodiments without departing from the scope of the inventive concept as defined in the claims.

What is claimed is:

1. A method of reading data from a nonvolatile memory device, the nonvolatile memory device including a plurality of cell strings, each cell string including a plurality of memory cells, at least two selection transistors disposed between the memory cells and a bit line, and at least two ground selection transistors disposed between the memory cells and a common source line wherein the memory cells, the string selection transistors, and the ground selection transistors are serially connected and stacked in a direction perpendicular to a substrate, the method comprising:

performing a preset operation, the preset operation comprising:
applying a first read voltage to a selected wordline;
applying a third read voltage to an unselected wordline;
applying a turn-on voltage to string selection transistors of a selected cell string;
applying the turn-on voltage to ground selection transistors of the selected cell string;
applying the turn-on voltage to string selection transistors of a unselected cell string; and applying the turn-on voltage to at least one of the ground selection transistors of the unselected cell string; and performing a read operation after performing the preset operation, the read operation comprising:
applying a second read voltage to the selected wordline;
applying the third read voltage to the unselected wordline;
applying the turn-on voltage to the string selection transistors of the selected cell string;
applying the turn-on voltage to the ground selection transistors of the selected cell string;
applying a turn-off voltage to the string selection transistors of the unselected cell string; and
applying the turn-off voltage to at least one of the ground selection transistors of the unselected cell string.

2. The method of claim 1, where the level of the first read voltage is equal with the level of the second read voltage and lower than the level of the third read voltage.

3. The method of claim 1, wherein the level of the first read voltage is higher than the level of the second read voltage and lower than the level of the third read voltage.

4. The method of claim 2 or 3, wherein the level of the third read voltage is substantially equal with the level of the turn-on voltage.

5. The method of claim 1, wherein the turn-on voltage is a power supply voltage.

6. The method of claim 1, wherein the selected cell string and the unselected cell string are connected to the same bitline, the selected cell string being a cell sting including a selected memory cell and the unselected cell string being other than the selected cell string in a memory cell array.

7. The method of claim 6, wherein the method further includes sensing data delivered to the bit line during the read operation with a sense amplifier.

8. The method of claim 7, wherein the cell strings are arranged on the substrate in rows and columns, a row of cell strings is connected in common to a string selection line, and two or more rows of cell strings are connected in common to a ground selection line.

9. The method of claim 8, wherein the turn-off voltage is a ground voltage.

10. A method of reading data from a nonvolatile memory device by performing a preset operation and a read operation sequentially, the nonvolatile memory device including a plurality of cell strings, each cell string including a plurality of memory cells, at least two selection transistors disposed between the memory cells and a bit line, and at least two ground selection transistors disposed between the memory cells and a common source line wherein the memory cells, the string selection transistors, and the ground selection transistors are serially connected and stacked in a direction perpendicular to a substrate, the method comprising:
applying a first turn-on voltage to string selection transistors of a selected cell string during the preset operation and the read operation;
applying a second turn-on voltage to one of ground selection transistors of the selected cell string during the preset operation and the read operation;
applying the first turn-on voltage to string selection transistors of a unselected cell string during the preset operation and thereafter, applying a turn-off voltage to the string selection transistors of the unselected cell string during the read operation; and applying the second turn-on voltage to one of the ground selection transistors of the unselected cell string during the preset operation and thereafter, applying the turn-off voltage to one of the ground selection transistors of the unselected cell string during the read operation,
wherein the first turn-on voltage and the second turn-on voltage are different from each other.

11. The method of claim 10, the method further including:
applying a first read voltage to a selected wordline during the preset operation and applying a second read voltage to the selected wordline during the read operation; and
applying a third read voltage to an unselected wordline during the preset operation and maintaining the third read voltage during the read operation,
wherein the level of the first read voltage is equal with the level of the second read voltage and lower than the level of the third read voltage.

12. The method of claim 10, the method further including:
applying a first read voltage to a selected wordline during the preset operation and applying a second read voltage to the selected wordline during the read operation; and
applying a third read voltage to an unselected wordline during the preset operation and maintaining the third read voltage during the read operation,
wherein the level of the first read voltage is higher than the level of the second read voltage and lower than the level of the third read voltage.

13. The method of claim 11 or 12, wherein the level of the third read voltage is substantially equal with the level of the first turn-on voltage.

14. The method of claim 10, wherein the first turn-on voltage is power supply voltage.

15. The method of claim 14, wherein the selected cell string and the unselected cell string are connected to the same bitline, the selected cell string being a cell sting including a selected memory cell and the unselected cell string being other than the selected cell string in a memory cell array.

16. The method of claim 15, wherein the method further includes sensing data delivered to the bit line during the read operation with a sense amplifier.

17. The method of claim 16, wherein the cell strings are arranged on the substrate in rows and columns, a row of cell strings is connected in common to a string selection line, and two or more rows of cell strings are connected in common to a ground selection line.

18. A method of reading data from a nonvolatile memory device by performing a preset operation and a read operation sequentially, the nonvolatile memory device including a plurality of cell strings, each cell string including a plurality of memory cells, at least two selection transistors disposed between the memory cells and a bit line, and at least two ground selection transistors disposed between the memory cells and a common source line wherein the memory cells, the string selection transistors, and the ground selection transistors are serially connected and stacked in a direction perpendicular to a substrate, the method comprising:
applying a first turn-on voltage to string selection transistors of a selected cell string during the preset operation and applying a second turn-on voltage to string selection transistors of a selected cell string during the read operation;
applying the first turn-on voltage to one of ground selection transistors of the selected cell string during the preset operation and applying the second turn-on voltage to one of the ground transistors of a selected cell string during the read operation;

applying the first turn-on voltage to string selection transistors of a unselected cell string during the preset operation and thereafter, applying a turn-off voltage to the string selection transistors of the unselected cell string during the read operation; and
applying the first turn-on voltage to one of the ground selection transistors of the unselected cell string during the preset operation and thereafter, applying the turn-off voltage to one of the ground selection transistors of the unselected cell string during the read operation,
wherein the first turn-on voltage is lower than the second turn-on voltage.

* * * * *